US010147757B2

(12) United States Patent
Lee et al.

(10) Patent No.: US 10,147,757 B2
(45) Date of Patent: Dec. 4, 2018

(54) IMAGE SENSOR STRUCTURES FOR FINGERPRINT SENSING

(71) Applicant: Synaptics Incorporated, San Jose, CA (US)

(72) Inventors: Young Seen Lee, Newark, CA (US); Paul Wickboldt, Walnut Creek, CA (US); Patrick Smith, San Jose, CA (US); Robert John Gove, Los Gatos, CA (US); Jason Goodelle, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 56 days.

(21) Appl. No.: 15/087,481

(22) Filed: Mar. 31, 2016

(65) Prior Publication Data

US 2016/0254312 A1 Sep. 1, 2016

Related U.S. Application Data

(63) Continuation-in-part of application No. 14/871,810, filed on Sep. 30, 2015, now Pat. No. 9,829,614.
(Continued)

(51) Int. Cl.
*H01L 27/146* (2006.01)
*G02B 27/30* (2006.01)
*G06K 9/00* (2006.01)

(52) U.S. Cl.
CPC ........ *H01L 27/14685* (2013.01); *G02B 27/30* (2013.01); *G06K 9/0004* (2013.01);
(Continued)

(58) Field of Classification Search
None
See application file for complete search history.

(56) References Cited

U.S. PATENT DOCUMENTS 5,446,290 A   8/1995  Fujieda et al.
5,726,443 A   3/1998  Chapman
              (Continued)

FOREIGN PATENT DOCUMENTS

CN      1451205 A    10/2003
CN    101814125 A     8/2010
             (Continued)

OTHER PUBLICATIONS

Rowe et al. "Multispectral Fingerprint Image Acquisition" Springer, New York, USA, 2008 pp. 3-23.
(Continued)

*Primary Examiner* — Benjamin Sandvik
(74) *Attorney, Agent, or Firm* — Leydig, Voit & Mayer, Ltd.

(57) ABSTRACT

Methods and systems for integrating image sensor structures with collimator filters, including manufacturing methods and associated structures for forming collimator filters at the wafer level for integration with image sensor semiconductor wafers. Methods of making an optical biometric sensor include forming a collimator filter layer on an image sensor wafer, wherein a plurality of light collimating apertures in the collimator filter layer are aligned with a plurality of light sensing elements in the image sensor wafer, and after forming the collimator filter layer on the image sensor wafer, singulating the image sensor wafer into a plurality of individual optical sensors.

17 Claims, 19 Drawing Sheets

Related U.S. Application Data

(60) Provisional application No. 62/238,603, filed on Oct. 7, 2015, provisional application No. 62/111,012, filed on Feb. 2, 2015.

(52) U.S. Cl.
CPC .. *H01L 27/14625* (2013.01); *H01L 27/14632* (2013.01); *H01L 27/14687* (2013.01)

(56) References Cited

U.S. PATENT DOCUMENTS

| | | |
|---|---|---|
| 5,991,467 A | 11/1999 | Kamiko |
| 6,128,399 A | 10/2000 | Calmel |
| 7,465,914 B2 | 12/2008 | Eliasson et al. |
| 7,535,468 B2 | 5/2009 | Uy |
| 7,697,053 B2 | 4/2010 | Kurtz et al. |
| 7,728,959 B2 | 6/2010 | Waldman et al. |
| 7,920,130 B2 | 4/2011 | Tien |
| 8,204,283 B2 | 6/2012 | Wu |
| 8,204,284 B2 | 6/2012 | Wu |
| 8,259,168 B2 | 9/2012 | Wu et al. |
| 8,311,514 B2 | 11/2012 | Bandyopadhyay et al. |
| 8,391,569 B2 | 3/2013 | Wu |
| 8,520,912 B2 | 8/2013 | Wu et al. |
| 8,570,303 B2 | 10/2013 | Chen |
| 8,649,001 B2 | 2/2014 | Wu et al. |
| 8,782,775 B2 | 7/2014 | Fadell et al. |
| 8,798,337 B2 | 8/2014 | Lei et al. |
| 8,903,140 B2 | 12/2014 | Wu |
| 8,917,387 B1 | 12/2014 | Lee et al. |
| 8,921,473 B1 | 12/2014 | Hyman |
| 8,994,690 B2 | 3/2015 | Shi et al. |
| 9,177,190 B1 | 11/2015 | Chou et al. |
| 9,208,394 B2 | 12/2015 | Di Venuto Dayer et al. |
| 9,437,132 B2 | 9/2016 | Rappoport et al. |
| 9,754,150 B2 | 9/2017 | Wu |
| 9,818,017 B2 | 11/2017 | Wu |
| 9,836,165 B2 | 12/2017 | Nho et al. |
| 2002/0054394 A1 | 5/2002 | Sasaki et al. |
| 2003/0090650 A1* | 5/2003 | Fujieda ................ G06K 9/0004 356/71 |
| 2004/0252867 A1 | 12/2004 | Lan et al. |
| 2006/0113622 A1* | 6/2006 | Adkisson .......... H01L 21/76819 257/443 |
| 2006/0152615 A1 | 7/2006 | Kwon et al. |
| 2007/0290284 A1* | 12/2007 | Shaffer .............. H01L 27/1446 257/432 |
| 2008/0121442 A1 | 5/2008 | Boer et al. |
| 2008/0237766 A1* | 10/2008 | Kim ................ H01L 31/02325 257/432 |
| 2009/0080709 A1* | 3/2009 | Rowe ................ G06K 9/00013 382/115 |
| 2010/0067757 A1* | 3/2010 | Arai .................... G06K 9/0004 382/128 |
| 2010/0172552 A1 | 7/2010 | Wu |
| 2010/0183200 A1 | 7/2010 | Wu |
| 2010/0204064 A1* | 8/2010 | Cho .................. G01N 21/6454 506/17 |
| 2010/0208952 A1 | 8/2010 | Wu |
| 2010/0208954 A1 | 8/2010 | Wu |
| 2010/0283756 A1 | 11/2010 | Ku et al. |
| 2011/0122071 A1 | 5/2011 | Powell |
| 2011/0233383 A1 | 9/2011 | Oku |
| 2012/0076370 A1 | 3/2012 | Lei et al. |
| 2012/0105614 A1 | 5/2012 | Wu et al. |
| 2012/0321149 A1 | 12/2012 | Carver et al. |
| 2012/0328170 A1 | 12/2012 | Wu et al. |
| 2013/0034274 A1 | 2/2013 | Wu et al. |
| 2013/0051635 A1 | 2/2013 | Wu et al. |
| 2013/0119237 A1 | 5/2013 | Raguin et al. |
| 2013/0120760 A1 | 5/2013 | Raguin et al. |
| 2013/0169780 A1 | 7/2013 | Wu |
| 2013/0222282 A1 | 8/2013 | Huang et al. |
| 2014/0125788 A1 | 5/2014 | Wu |
| 2014/0218327 A1 | 8/2014 | Shi et al. |
| 2014/0355846 A1 | 12/2014 | Lee et al. |
| 2015/0062088 A1 | 3/2015 | Cho et al. |
| 2015/0078633 A1 | 3/2015 | Hung |
| 2015/0109214 A1 | 4/2015 | Shi et al. |
| 2015/0187827 A1 | 7/2015 | Tu et al. |
| 2015/0331508 A1 | 11/2015 | Nho et al. |
| 2015/0347812 A1 | 12/2015 | Lin |
| 2015/0347813 A1 | 12/2015 | Tsen |
| 2015/0369661 A1 | 12/2015 | Lin |
| 2015/0371074 A1 | 12/2015 | Lin |
| 2015/0371075 A1 | 12/2015 | Lin |
| 2016/0092717 A1 | 3/2016 | Ling |
| 2016/0132712 A1* | 5/2016 | Yang .................... G06K 9/0002 348/77 |
| 2016/0246396 A1 | 8/2016 | Dickinson et al. |
| 2016/0247010 A1 | 8/2016 | Huang et al. |
| 2016/0283772 A1 | 9/2016 | Nelson |
| 2016/0328595 A1* | 11/2016 | Sun .................. H01L 27/14629 |
| 2017/0257534 A1 | 9/2017 | Huang et al. |
| 2017/0279948 A1 | 9/2017 | Hong |
| 2017/0300736 A1 | 10/2017 | Song et al. |
| 2017/0316250 A1 | 11/2017 | Roh et al. |

FOREIGN PATENT DOCUMENTS

| | | |
|---|---|---|
| CN | 101814126 B | 8/2010 |
| CN | 102073860 A | 5/2011 |
| CN | 102467660 A | 5/2012 |
| CN | 102682280 A | 9/2012 |
| CN | 202443032 U | 9/2012 |
| CN | 102842026 A | 12/2012 |
| CN | 202632318 U | 12/2012 |
| CN | 102915430 A | 2/2013 |
| CN | 102955936 A | 3/2013 |
| CN | 101814126 A | 4/2013 |
| CN | 102682280 B | 6/2013 |
| CN | 103198289 A | 7/2013 |
| CN | 102467660 B | 11/2013 |
| CN | 103810483 A | 5/2014 |
| CN | 103942537 A | 7/2014 |
| CN | 104035620 A | 9/2014 |
| CN | 104063704 A | 9/2014 |
| CN | 203838722 U | 9/2014 |
| CN | 104182727 A | 12/2014 |
| CN | 204028936 U | 12/2014 |
| CN | 104463074 A | 3/2015 |
| CN | 102915430 B | 8/2015 |
| CN | 102842026 B | 9/2015 |
| CN | 102955936 B | 9/2015 |
| CN | 105989325 A | 10/2016 |
| EP | 2437201 A2 | 4/2012 |
| EP | 2437201 A3 | 4/2012 |
| EP | 2447883 A1 | 5/2012 |
| EP | 2555137 A1 | 2/2013 |
| EP | 2562683 A1 | 2/2013 |
| JP | 3177550 U | 8/2012 |
| KR | 20120003165 U | 5/2012 |
| KR | 200462271 Y1 | 9/2012 |
| KR | 20130016023 A | 2/2013 |
| KR | 20130022364 A | 3/2013 |
| KR | 101259310 B1 | 5/2013 |
| KR | 101307002 B1 | 9/2013 |
| KR | 10-2017-0122386 A | 11/2017 |
| TW | 201214303 A1 | 4/2010 |
| TW | 201027436 A1 | 7/2010 |
| TW | 201032145 A1 | 9/2010 |
| TW | 201115479 A1 | 5/2011 |
| TW | M435680 U1 | 3/2012 |
| TW | 201301144 A1 | 1/2013 |
| TW | I382349 B1 | 1/2013 |
| TW | I382350 B1 | 1/2013 |
| TW | I450201 B | 2/2013 |
| TW | 201310353 A1 | 3/2013 |
| TW | 201329872 A1 | 7/2013 |
| TW | 201419165 A | 5/2014 |
| TW | I444904 B | 7/2014 |
| TW | I448973 B | 8/2014 |
| TW | I457842 B | 10/2014 |

(56) References Cited

FOREIGN PATENT DOCUMENTS

| TW | 201441940 A | 11/2014 |
|---|---|---|
| TW | I456510 B | 12/2014 |
| TW | 201308215 A1 | 2/2015 |
| TW | 201506807 A | 2/2015 |
| WO | WO 2015/041459 A1 | 3/2015 |
| WO | WO 2015/140600 A1 | 9/2015 |
| WO | WO 2016/119492 A1 | 8/2016 |
| WO | WO 2016/154378 A1 | 9/2016 |
| WO | WO 2017/183910 A2 | 10/2017 |
| WO | WO 2017/202323 A1 | 11/2017 |

OTHER PUBLICATIONS

Vkansee Presentation prior to Sep. 30, 2015.

Cho, et al, "Embedded Nano-Si Optical Sensor in TFT-LCDs Technology and Integrated as Touch-Input Display" *Digest of Technical Papers*. vol. 42, No. 1., 2011, pp. 1818-1821.

Brown, et al., "A Continuous-Grain Silicon-System LCD With Optical Input Function" IEEE Journal of Solid-State Circuits, Dec. 12, 2007, vol. 42.

Atpina Technology White Paper "An Objective Look at FSI and BSI" May 18, 2010, 6 pages.

Durini, "High Performance Silicon Imaging: Fundamentals and Applications of CMOS and CCD Sensors" *Woodhead Publishing Series in Electronic and Optical Materials* 1$^{st}$ edition; May 8, 2014, pp. 98-107.

International Search Report and Written Opinion of the International Searching Authority for PCT/US2016/055574 dated Jan. 10, 2017.

Vikansee, "UTFIS Revolutionary fingerprint sensing technology", Jan. 14, 2015.

U.S. Appl. No. 62/156,758, filed May 4, 2015.
U.S. Appl. No. 62/190,267, filed Jul. 9, 2015.
U.S. Appl. No. 62/138,107, filed Mar. 25, 2015.
U.S. Appl. No. 62/347,073, filed Jun. 7, 2016.
U.S. Appl. No. 62/330,833, filed May 2, 2016.
U.S. Appl. No. 62/289,328, filed Jan. 31, 2016.
U.S. Appl. No. 62/249,832, filed Nov. 2, 2015.
U.S. Appl. No. 62/078,427, filed Nov. 12, 2014.

* cited by examiner

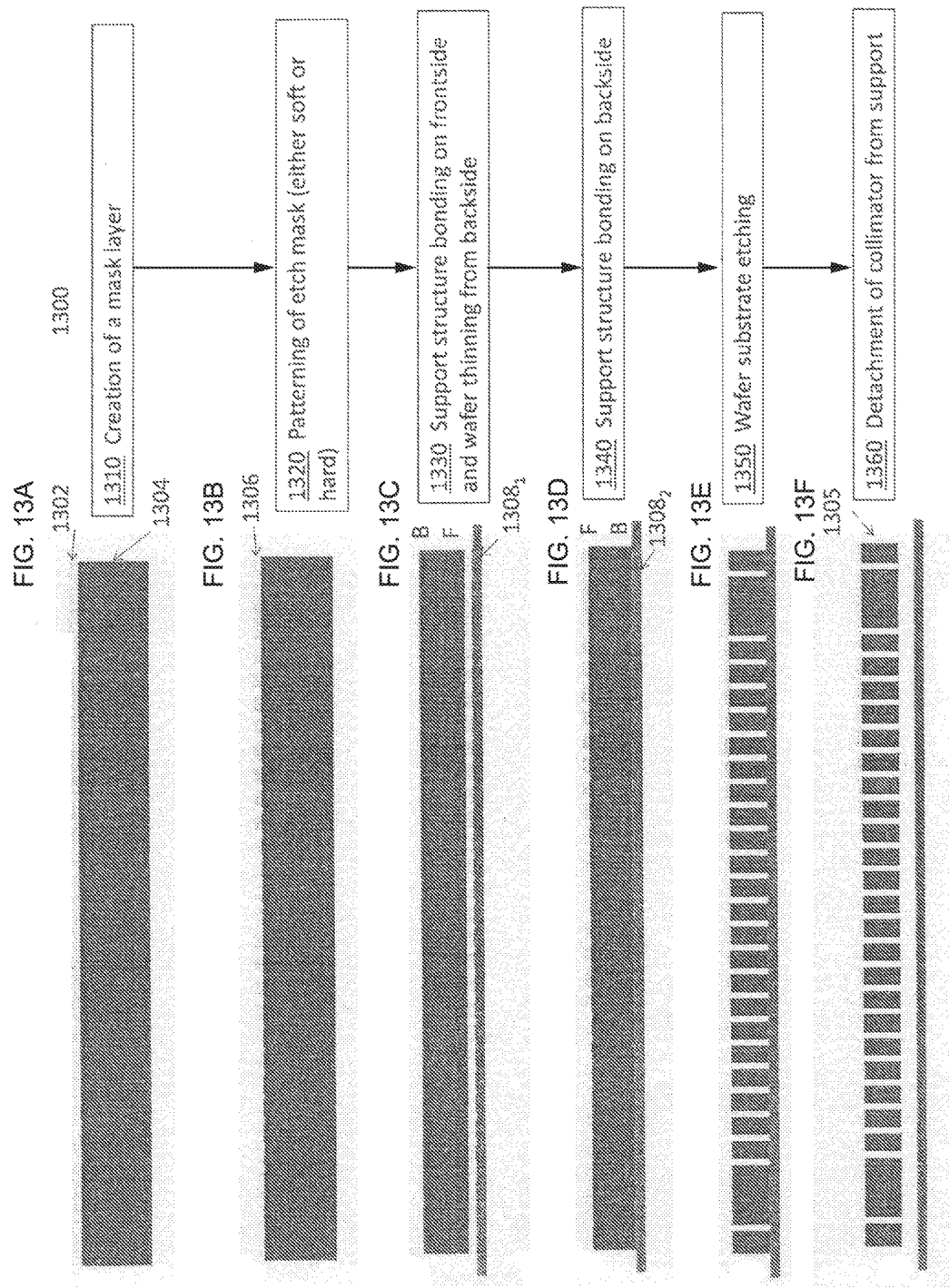

1702
1704
1710 Creation of a mask layer 1706
1720 Patterning of etch mask (either soft or hard) and support structure bonding
1708

1730 Partial wafer substrate etching, detachment from support structure

1740 Bonding of collimator filter wafer to image sensor wafer

1750 Thinning of collimator filter wafer

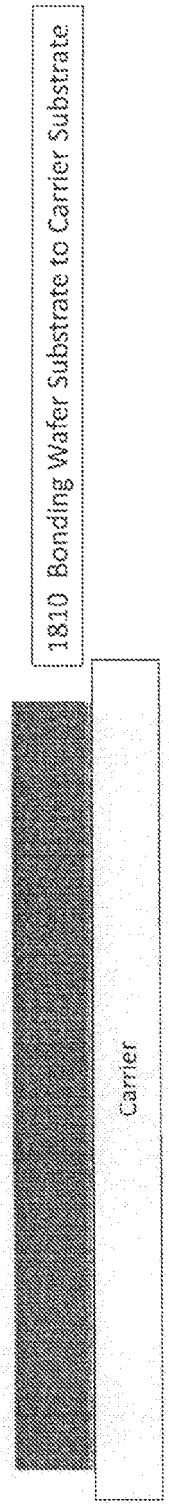
FIG. 18A — 1810 Bonding Wafer Substrate to Carrier Substrate
FIG. 18B — 1820 Thinning of Wafer Substrate
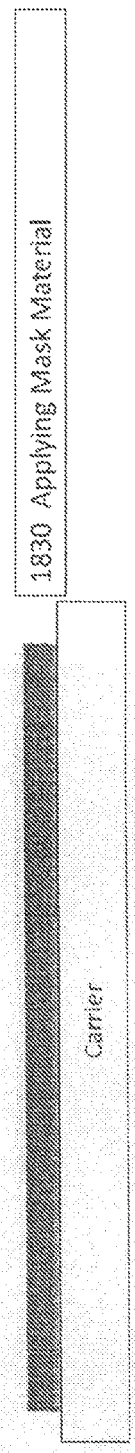
FIG. 18C — 1830 Applying Mask Material
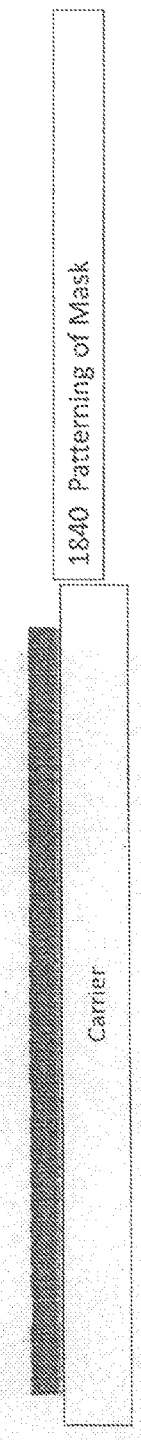
FIG. 18D — 1840 Patterning of Mask

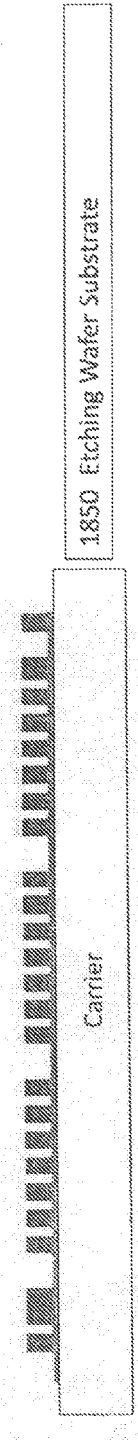
FIG. 18E — 1850 Etching Wafer Substrate
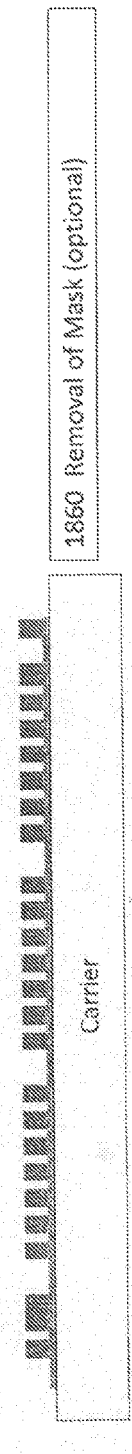
FIG. 18F — 1860 Removal of Mask (optional)
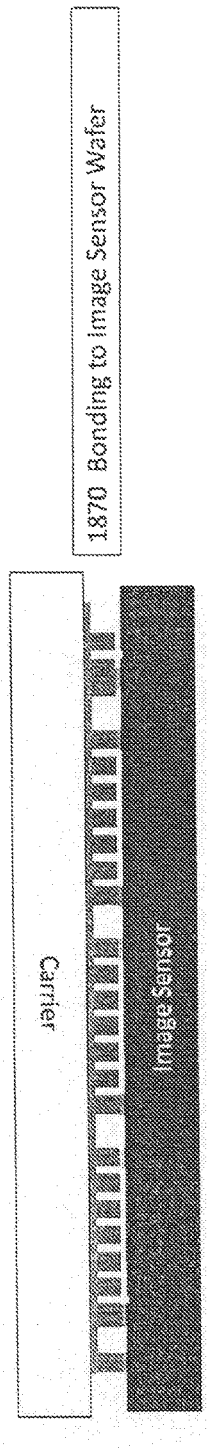
FIG. 18G — 1870 Bonding to Image Sensor Wafer
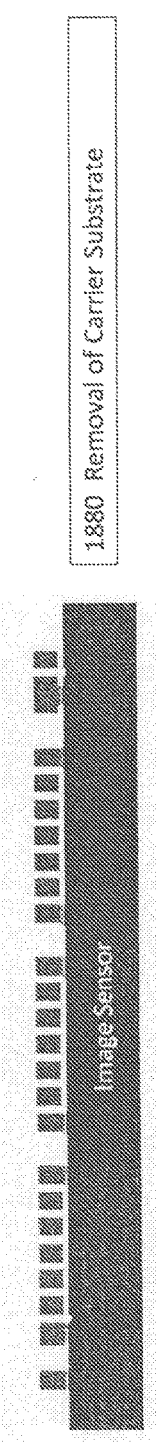
FIG. 18H — 1880 Removal of Carrier Substrate

IMAGE SENSOR STRUCTURES FOR FINGERPRINT SENSING

CROSS-REFERENCE TO RELATED APPLICATIONS

The present application claims the benefit under 35 U.S.C. § 119(e) of U.S. Provisional Application Ser. No. 62/238,603, filed Oct. 28, 2015, and titled "IMAGE SENSOR STRUCTURES FOR FINGERPRINT SENSORS," which is hereby incorporated by reference in its entirety. The present application is also a Continuation-in-Part of U.S. Non-Provisional patent application Ser. No. 14/871,810, filed Sep. 30, 2015, which claims the benefit of U.S. Provisional Patent Application No. 62/111,012, filed Feb. 2, 2015.

FIELD

This disclosure generally relates to optical sensors, and more particularly to an optical sensor using a collimator.

BACKGROUND

Object imaging is useful in a variety of applications. By way of example, biometric recognition systems image biometric objects for authenticating and/or verifying users of devices incorporating the recognition systems. Biometric imaging provides a reliable, non-intrusive way to verify individual identity for recognition purposes. Various types of sensors may be used for biometric imaging.

Fingerprints, like various other biometric characteristics, are based on distinctive personal characteristics and thus provide a reliable mechanism to recognize an individual. Thus, fingerprint sensors have many potential applications. For example, fingerprint sensors may be used to provide access control in stationary applications, such as security checkpoints. Fingerprint sensors may also be used to provide access control in mobile devices, such as cell phones, wearable smart devices (e.g., smart watches and activity trackers), tablet computers, personal data assistants (PDAs), navigation devices, and portable gaming devices. Accordingly, some applications, in particular applications related to mobile devices, may require recognition systems that are both small in size and highly reliable.

Most commercially available fingerprint sensors are based on optical or capacitive sensing technologies. Unfortunately, conventional optical fingerprint sensors are too bulky to be packaged in mobile devices and other common consumer electronic devices, confining their use to door access control terminals and other applications where sensor size is not a restriction.

As a result, fingerprint sensors in most mobile devices are capacitive sensors having a sensing array configured to sense ridge and valley features of a fingerprint. Typically, these fingerprint sensors either detect absolute capacitance (sometimes known as "self-capacitance") or trans-capacitance (sometimes known as "mutual capacitance"). In either case, capacitance at each sensing element in the array varies depending on whether a ridge or valley is present, and these variations are electrically detected to form an image of the fingerprint.

While capacitive fingerprint sensors provide certain advantages, most commercially available capacitive fingerprint sensors have difficulty sensing fine ridge and valley features through large distances, requiring the fingerprint to contact a sensing surface that is close to the sensing array. It remains a significant challenge for a capacitive sensor to detect fingerprints through thick layers, such as the thick cover glass (sometimes referred to herein as a "cover lens") that protects the display of many smart phones and other mobile devices. To address this issue, a cutout is often formed in the cover glass in an area beside the display, and a discrete capacitive fingerprint sensor (often integrated with a mechanical button) is placed in the cutout area so that it can detect fingerprints without having to sense through the cover glass. The need for a cutout makes it difficult to form a flush surface on the face of device, detracting from the user experience, and complicating the manufacture. The existence of mechanical buttons also takes up valuable device real estate.

SUMMARY

Embodiments of the disclosure provide methods and systems for integrating image sensor structures with collimator filters, including manufacturing methods and associated structures for forming collimator filters at the wafer level for integration with image sensor semiconductor wafers.

According to an embodiment, a method of making an optical biometric sensor (e.g., optical fingerprint sensor) is provided. The method typically includes forming a collimator filter layer on an image sensor wafer, wherein a plurality of light collimating apertures in the collimator filter layer are aligned with a plurality of light sensing elements in the image sensor wafer, and after forming the collimator filter layer on the image sensor wafer, singulating the image sensor wafer into a plurality of individual optical sensors. In certain aspects, forming the collimator filter layer includes forming the plurality of light collimating apertures and routing circuitry for light sensing elements of the image sensor wafer in one or more redistribution layers disposed on a front side of the image sensor wafer. In certain aspects, forming the plurality of collimator filter layer comprises forming the light collimating apertures into a back side of the image sensor wafer, wherein a front side of the image sensor wafer includes one or more redistribution layers. In certain aspects, forming the collimator filter layer on the image sensor wafer includes forming a collimator filter wafer having the plurality of light collimating apertures, and attaching the collimator filter wafer to the image sensor wafer.

BRIEF DESCRIPTION OF THE DRAWINGS

The invention will be described in even greater detail below based on the exemplary figures. The invention is not limited to the exemplary embodiments. The features described and/or illustrated herein can be used alone or combined in different combinations in embodiments of the invention. Further, features and advantages of various embodiments of the invention will become apparent by reading the following detailed description with reference to the attached drawings, which illustrate the following:

FIG. 8 depicts a front-side illuminated CMOS detector, with a collimator filter etched into the RDL layer.

FIG. 9 depicts a front-side illuminated CMOS detector, with a collimator filter etched into the RDL layer, and with photo detectors that discriminate the angle of light.

FIG. 10 depicts a CMOS detector (sensor ASIC), with a collimator filter, and with a second ASIC (digital ASIC) mounted to it.

FIG. 11 depicts a Back-side illumination image sensor with TSV substrate mount FIG. 1. Silicon collimator filter bonded to an image sensor FIG. 13 depicts a process flow for forming an image sensor structure with a collimator filter in accordance with an embodiment of the present disclosure.

FIG. 18 depicts another process flow for an alternate way of forming an image sensor structure with a collimator filter in accordance with an embodiment of the present disclosure.

DETAILED DESCRIPTION

The following detailed description is exemplary in nature and is not intended to limit the invention or the application and uses of the invention. Furthermore, there is no intention to be bound by any expressed or implied theory presented in the preceding technical field, background, summary, brief description of the drawings, or the following detailed description.

Turning to the drawings, and as described in greater detail herein, embodiments of the disclosure provide methods and systems to optically image an input object such as a fingerprint. In particular, a method and system is described wherein an optical sensor includes a collimator filter layer which operates as a light conditioning layer, interposed between a sensing region and an image sensor array. Light from a sensing region is filtered by the collimator filter layer such that only certain of the reflected light beams reach optical sensing elements (also "sensing pixels" or "light sensing elements") in the image sensor array.

Employing the collimator filter layer of the present disclosure prevents blurring while allowing for a lower-profile image sensor, such as a fingerprint sensor, than is possible with purely lens-based or pinhole camera-based imaging sensors. Thus, the image sensor can be made thin for use in mobile devices such as cell phones. Placing individual collimator apertures over each optical sensing element, or group of elements, provides better sensitivity than purely pinhole based imagers by transmitting more light to the optical sensing elements. The present disclosure describes the use of the collimator filter layer to enable optical sensing through a large range of thicknesses of cover layers.

Embodiments of the disclosure also provide methods and systems for integrating image sensor structures with collimator filters, including manufacturing methods and associated structures for forming collimator filters at the wafer level for integration with image sensor semiconductor wafers.

Figure 1:
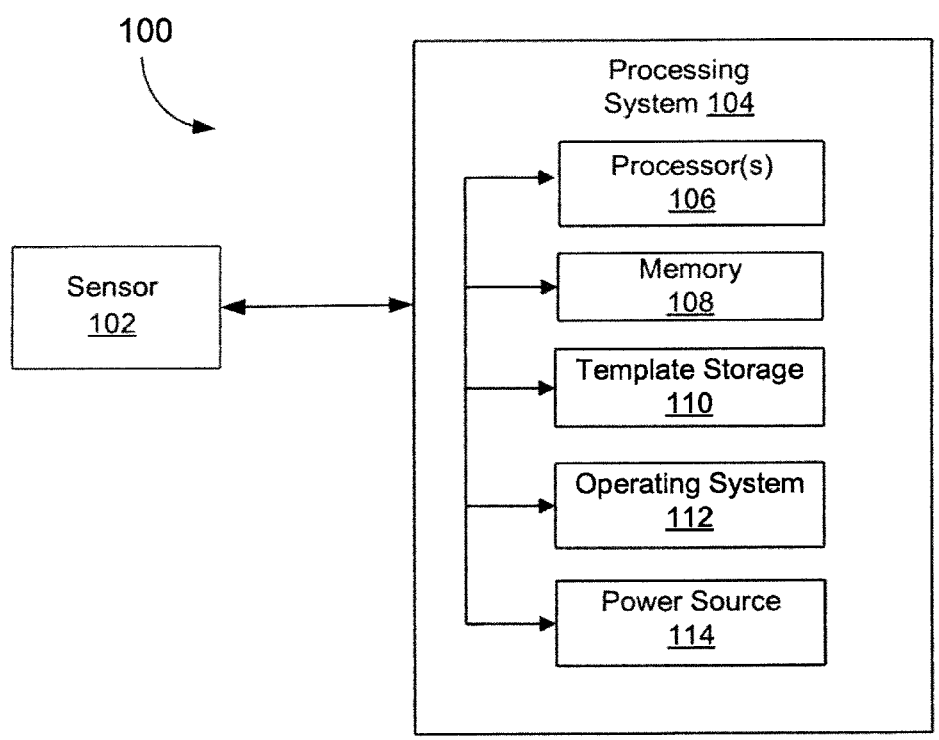
FIG. 1 is a block diagram of an example of a system that includes an optical sensor and a processing system, according to an embodiment of the disclosure.

FIG. 1 is a block diagram of an example of an electronic system 100 that includes an optical sensor device 102 and a processing system 104, according to an embodiment of the disclosure. By way of example, basic functional components of the electronic device 100 utilized during capturing, storing, and validating a biometric match attempt are illustrated. The processing system 104 includes processor(s) 106, a memory 108, a template storage 110, an operating system (OS) 112, and a power source 114. Each of the processor(s) 106, the memory 108, the template storage 110, and the operating system 112 are interconnected physically, communicatively, and/or operatively for inter-component communications. The power source 114 is interconnected to the various system components to provide electrical power as necessary.

As illustrated, processor(s) 106 are configured to implement functionality and/or process instructions for execution within electronic device 100 and the processing system 104. For example, processor(s) 106 execute instructions stored in memory 108 or instructions stored on template storage 110 to identify a biometric object or determine whether a biometric authentication attempt is successful or unsuccessful. Memory 108, which may be a non-transitory, computer-readable storage medium, is configured to store information within electronic device 100 during operation. In some embodiments, memory 108 includes a temporary memory, an area for information not to be maintained when the electronic device 100 is turned off. Examples of such temporary memory include volatile memories such as random access memories (RAM), dynamic random access memories (DRAM), and static random access memories (SRAM). Memory 108 also maintains program instructions for execution by processor(s) 106.

Template storage 110 comprises one or more non-transitory computer-readable storage media. In the context of a fingerprint sensor, the template storage 110 is generally configured to store enrollment views for fingerprint images for a user's fingerprint or other enrollment information. More generally, the template storage 110 may be used to store information about an object. The template storage 110 may further be configured for long-term storage of information. In some examples, the template storage 110 includes non-volatile storage elements. Non-limiting examples of non-volatile storage elements include magnetic hard discs, solid-state drives (SSD), optical discs, floppy discs, flash memories, or forms of electrically programmable memories (EPROM) or electrically erasable and programmable (EEPROM) memories, among others.

The processing system 104 also hosts an operating system (OS) 112. The operating system 112 controls operations of the components of the processing system 104. For example, the operating system 112 facilitates the interaction of the processor(s) 106, memory 108 and template storage 110.

According to various embodiments, the processor(s) 106 implement hardware and/or software to obtain data describing an image of an input object. The processor(s) 106 may also align two images and compare the aligned images to one another to determine whether there is a match. The processor(s) 106 may also operate to reconstruct a larger image from a series of smaller partial images or sub-images, such as fingerprint images when multiple partial fingerprint images are collected during a biometric process, such as an enrollment or matching process for verification or identification.

The processing system 104 includes a power source 114 (or one or more power sources) to provide power to the electronic device 100. Non-limiting examples of the power source 114 include single-use power sources, rechargeable power sources, and/or power sources developed from nickel-cadmium, lithium-ion, or other suitable material as well as power cords and/or adapters which are in turn connected to electrical power.

Optical sensor 102 can be implemented as a physical part of the electronic system 100, or can be physically separate from the electronic system 100. As appropriate, the optical sensor 102 may communicate with parts of the electronic system 100 using any one or more of the following: buses, networks, and other wired or wireless interconnections. In some embodiments, optical sensor 102 is implemented as a fingerprint sensor to capture a fingerprint image of a user. In accordance with the disclosure, the optical sensor 102 uses optical sensing for the purpose of object imaging including imaging biometrics such as fingerprints. The optical sensor 102 can be incorporated as part of a display, for example, or may be a discrete sensor.

Some non-limiting examples of electronic systems 100 include personal computers of all sizes and shapes, such as desktop computers, laptop computers, netbook computers, tablets, web browsers, e-book readers, and personal digital assistants (PDAs). Additional exemplary electronic systems 100 include composite input devices, such as physical keyboards and separate joysticks or key switches. Further exemplary electronic systems 100 include peripherals such as data input devices (including remote controls and mice) and data output devices (including display screens and printers). Other examples include remote terminals, kiosks, video game machines (e.g., video game consoles, portable gaming devices, and the like), communication devices (including cellular phones, such as smart phones), and media devices (including recorders, editors, and players such as televisions, set-top boxes, music players, digital photo frames, and digital cameras).

The optical sensor 102 may provide illumination to the sensing region. Reflections from the sensing region in the illumination wavelength(s) are detected to determine input information corresponding to the input object.

The optical sensor 102 may utilize principles of direct illumination of the input object, which may or may not be in contact with a sensing surface of the sensing region depending on the configuration. One or more light sources and/or light guiding structures may be used to direct light to the sensing region. When an input object is present, this light is reflected from surfaces of the input object, which reflections can be detected by the optical sensing elements and used to determine information about the input object.

The optical sensor 102 may also utilize principles of internal reflection to detect input objects in contact with a sensing surface. One or more light sources may be used to direct light in a light guiding element at an angle at which it is internally reflected at the sensing surface of the sensing region, due to different refractive indices at opposing sides of the boundary defined by the sensing surface. Contact of the sensing surface by the input object causes the refractive index to change across this boundary, which alters the internal reflection characteristics at the sensing surface, causing light reflected from the input object to be weaker at portions where it is in contact with the sensing surface. Higher contrast signals can often be achieved if principles of frustrated total internal reflection (FTIR) are used to detect the input object. In such embodiments, the light may be directed to the sensing surface at an angle of incidence at which it is totally internally reflected, except where the input object is in contact with the sensing surface and causes the light to partially transmit across this interface. An example of this is presence of a finger introduced to an input surface defined by a glass to air interface. The higher refractive index of human skin compared to air causes light incident at the sensing surface at the critical angle of the interface to air to be partially transmitted through the finger, where it would otherwise be totally internally reflected at the glass to air interface. This optical response can be detected by the system and used to determine spatial information. In some embodiments, this can be used to image small scale fingerprint features, where the internal reflectivity of the incident light differs depending on whether a ridge or valley is in contact with that portion of the sensing surface.

Figure 2:
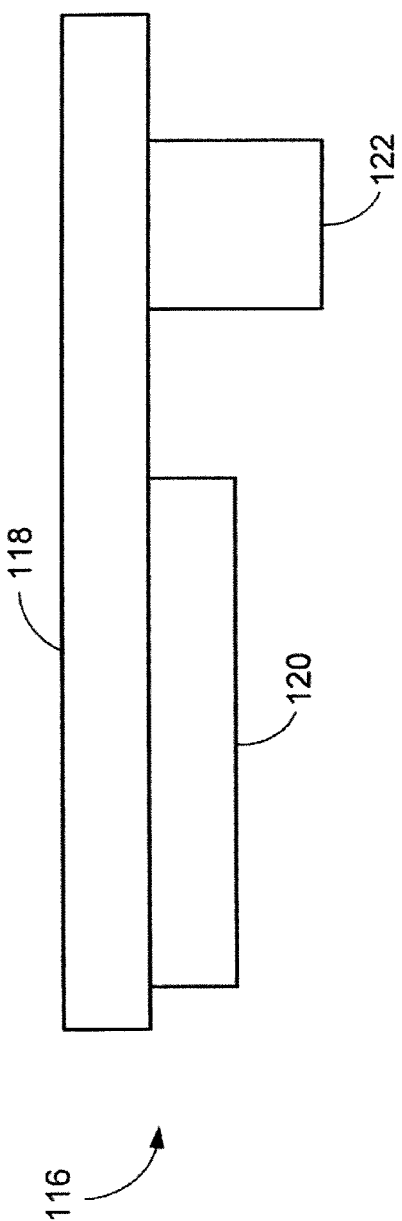
FIG. 2 illustrates an example of a mobile device that includes an optical sensor according to an embodiment of the disclosure.

FIG. 2 illustrates an example of an electronic device 116, such as a mobile phone, which includes cover glass (or cover lens) 118 over a display 120. The disclosed method and system may be implemented by using the display 120 as the optical sensor to image an input object. Alternatively, a separate discrete component 122 provides the optical sensing capabilities. Alternatively, or additionally, a separate discrete component 122 that provides optical sensing capabilities can be located under display 120.

Figure 3:
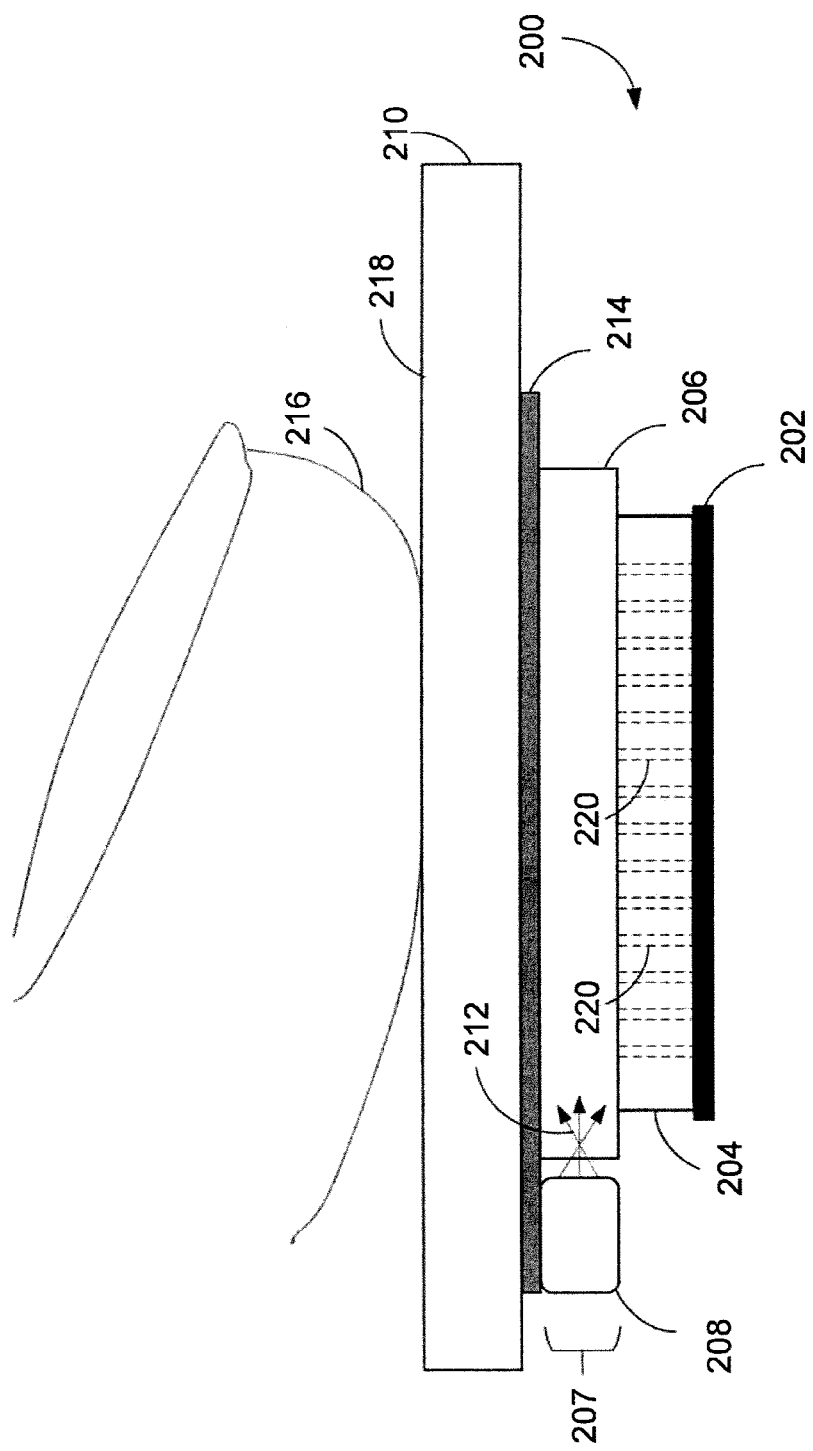
FIG. 3 illustrates an example of an optical sensor with a collimator filter layer according to an embodiment of the disclosure.

FIG. 3 illustrates an example of a stack-up for an optical image sensor device 200 used to image an object 216, such as a fingerprint. The sensor 200 includes an image sensor array 202, a light collimator filter layer or light conditioning layer 204 disposed above the image sensor array 202, an illumination layer 207 disposed above the collimator filter layer 204, a light source 208, and a cover layer 210. In certain embodiments, a blocking layer 214 may also be provided.

The cover layer 210 protects the inner components of the sensor 200 such as the image sensor array 202. The cover layer 210 may include a cover glass or cover lens that protects inner components of a display in addition to the sensor 200. A sensing region for the input object is defined above the cover layer 210. A top surface 218 of the cover layer 210 may form a sensing surface, which provides a contact area for the input object 216 (e.g., fingerprint). The cover layer 210 is made of any material such as glass, transparent polymeric materials and the like.

Although generally described in the context of a fingerprint for illustrative purposes, the input object 216 is any object to be imaged. Generally, the object 216 will have various features. By way of example, the object 216 has ridges and valleys. Due to their protruding nature, the ridges contact the sensing surface 218 of the cover 210 layer. In contrast, the valleys do not contact the sensing surface 218 and instead form an air gap between the input object 216 and the sensing surface 218. The object 216 may have other features such as stain, ink and the like that do not create significant structural differences in portions of the input object 216, but which affect its optical properties. The methods and systems disclosed herein are suitable for imaging such structural and non-structural features of the input object 216.

The illumination layer 207 includes a light source 208 and/or a light guiding element 206 that directs illumination to the sensing region in order to image the input object. As shown in FIG. 3, the light source 208 transmits beams or rays of light 212 into the light guiding element 206, and the transmitted light propagates through the light guiding element 206. The light guiding element may utilize total internal reflection, or may include reflecting surfaces that extract light up towards the sensing region. Some of the light in the illumination layer may become incident at the sensing surface 218 in an area that is in contact with the input object 216. The incident light is in turn reflected back towards the collimator filter layer 204. In the example shown, the light source 208 is disposed adjacent to the light guiding element 206. However, it will be understood that the light source 208 may be positioned anywhere within the sensor 200 provided that the emitted light reaches the light guiding element 206. For example, the light source 208 may be disposed below the image sensor array 202. Moreover, it will be understood that a separate light guiding element 206 is not required. For example, the light transmitted from the light source 208 can be transmitted directly into the cover layer 210 in which case the cover layer 210 also serves as the light guiding element. As another example, the light transmitted from the light source 208 can be transmitted directly to the sensing region, in which case the light source 208 itself serves as the illumination layer.

A discrete light source is also not required. For example, the method and system contemplate using the light provided by a display or the backlighting from an LCD as suitable light sources. The light provided by the illumination layer 207 to image the object 216 may be in near infrared (NIR) or visible. The light can have a narrow band of wavelengths, a broad band of wavelengths, or operate in several bands.

The image sensor array 202 detects light passing through the light collimator filter layer 204. Examples of suitable sensor arrays are complementary metal oxide semiconductor (CMOS) and charge coupled device (CCD) sensor arrays. The sensor array 202 includes a plurality of individual optical sensing elements capable of detecting the intensity of incident light.

To achieve optical sensing of fingerprints and fingerprint-sized features through thicker cover layers 210, light reflected from the fingerprint is conditioned by the light collimator filter layer 204 so that the light reaching a sensing element in the image sensor array 202 comes only from a small spot on the input object 216 directly above the sensor element. In the absence of such conditioning, any light arriving at a sensing element from a region on the object far away from the optical sensing elements contributes to image blurring.

To condition the light in accordance with the disclosure, the collimator filter layer 204 is provided with an array of apertures (also referred to herein as collimator holes, or collimator filter holes or collimator vias, or simply holes) 220 with each aperture being directly above one or more optical sensing elements on the image sensor array 202. The apertures 220 are formed using any suitable technique, such as laser drilling, etching and the like. It should be understood that the apertures (collimator holes, or collimator filter holes or collimator vias, or holes) of the present disclosure define regions or hole structures in the wafer or substrate that may be free of conductive material. The holes may be made of an optically clear material, or they may be devoid of material (e.g., physical voids in the material in which the hole is formed).

The collimator filter layer 204 only allows light rays reflected from the input object 216 (e.g., finger) at normal or near normal incidence to the collimator filter layer 204 to pass and reach the optical sensing elements of the image sensor array 204. In one embodiment, the collimator filter layer 204 is an opaque layer with array of holes 220. The collimator filter layer 204 is laminated, stacked, or built directly above the image sensor array 202. By way of example, the collimator filter layer 204 may be made of plastic materials, such as polycarbonate, PET, or polyimide, carbon black, inorganic insulating or metallic materials, silicon, or SU-8. In certain embodiments, the collimator filter layer 204 is monolithic.

Also shown in FIG. 3 is blocking layer 214, which is optionally provided as part of optical sensor 200. The blocking layer 214 is a semitransparent or opaque layer that may be disposed above the collimator filter layer 204. By way of example, the blocking layer may be disposed between the cover layer 210 and the illumination layer 207, as shown in FIG. 3. Alternatively, the blocking layer 214 may be disposed between the illumination layer 207 and the collimator filter layer 204. In either case, the blocking layer 214 obscures components of the sensor 200, such as the apertures in the collimator filter layer, from ambient light illumination, while still allowing the sensor 200 to operate. The blocking layer 214 may include of a number of different materials or sub-layers. For example, a thin metal or electron conducting layer may be used where the layer thickness is less than the skin depth of light penetration in the visible spectrum. Alternately, the blocking layer 214 may include a dye and/or pigment or several dyes and/or pigments that absorb light, for example, in the visible spectrum. As yet another alternative, the blocking layer 214 may include several sub-layers or nano-sized features designed to cause interference with certain wavelengths, such as visible light for example, so as to selectively absorb or reflect different wavelengths of light. The light absorption profile of the blocking layer 214 may be formulated to give a particular appearance of color, texture, or reflective quality thereby allowing for particular aesthetic matching or contrasting with the device into which the optical sensor 200 is integrated. If visible illumination wavelengths are used, a semitransparent layer may be used to allow sufficient light to pass through the blocking layer to the sensing region, while still sufficiently obscuring components below.

Figure 4:
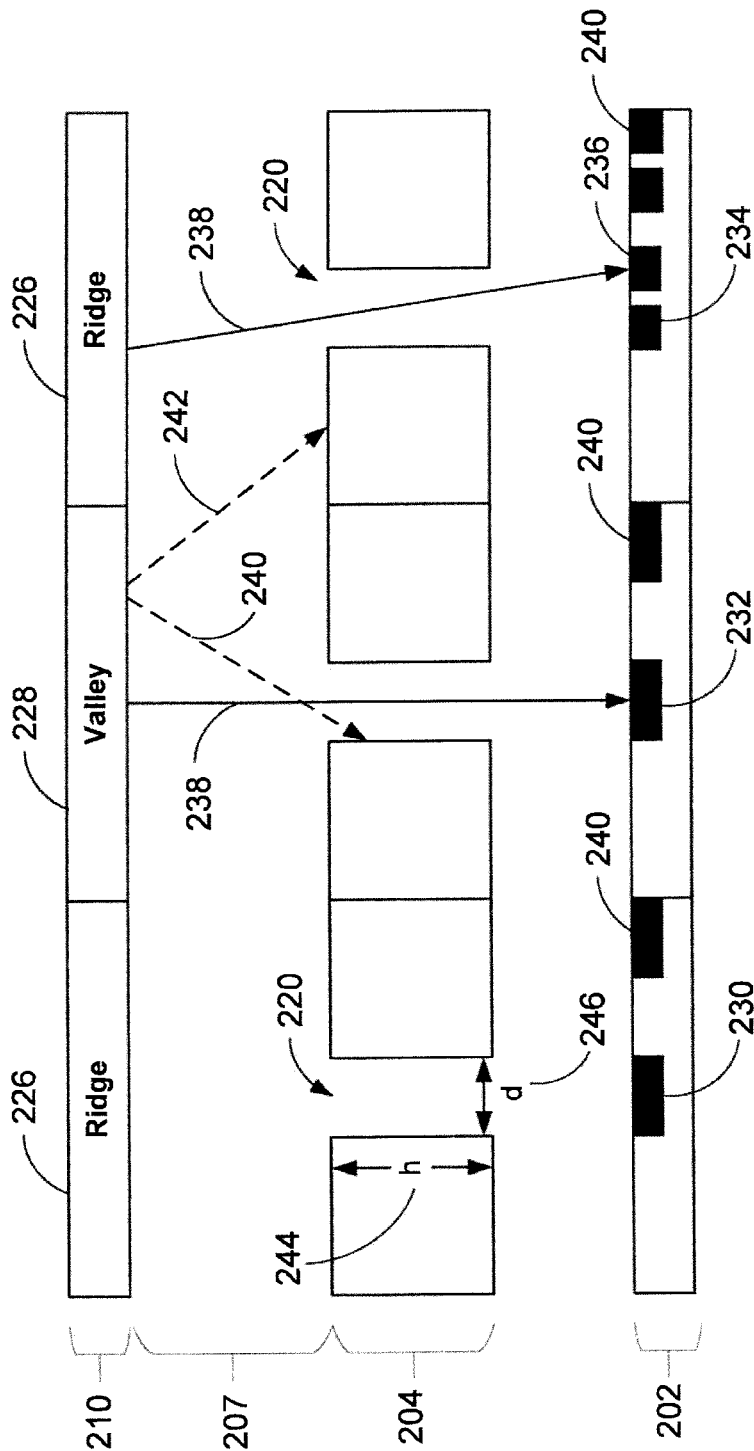
FIG. 4 illustrates an example of light interacting with an optical sensor having a collimator filter layer according to an embodiment of the disclosure.

FIG. 4 illustrates a closer view of the collimator filter layer 204 disposed between the illumination layer 207 and the image sensor array 202 and interaction of light within the sensor 200. Portions 226 of the cover layer 210 are in contact with ridges of the input object 216 and portion 228 of the cover layer 210 is in contact with air due to the presence of a valley of object 216. Image sensor array 202 includes optical sensing elements 230, 232, 234 and 236 disposed below apertures or holes 220 of the collimator filter layer 204.

Illustratively shown are a series of light rays reflected at the cover layer 210. For example, light rays 238 reflect from the cover layer 210 at portions occupied by ridges or valleys of the object 216. Because the light rays 238 are above collimator apertures 220 and are relatively near normal, the light rays 238 pass through the apertures 220 in the collimator filter layer 204 and become incident on optical sensing elements 232 and 236, for example. The optical sensing elements can then be used to measure the intensity of light and convert the measured intensity into image data of the input object 216. On the other hand, light beams 240 and 242, which have a larger angle from normal, strike the collimator filter layer 204, either on its top surface or at surface within the aperture (e.g., aperture sidewall) and are blocked and prevented from reaching optical sensing elements in the image sensor array 202.

A useful metric of the collimator filter layer 204 is an aspect ratio of the apertures or holes 220. The aspect ratio is the height of the holes (h) 244 in the collimator filter layer 204 divided by hole diameter (d) 246. The aspect ratio should be sufficiently large to prevent "stray" light from reaching the optical sensing elements directly under each collimator hole. An example of stray light is light ray 242 reflected from portion 228 of the cover layer 210 (e.g., a valley), which would reach sensing elements underneath a ridge in the absence of the collimator filter layer. Larger aspect ratios restrict the light acceptance cone to smaller angles, improving the optical resolution of the system. The minimum aspect ratio can be estimated using a ratio of the distance from the collimator filter layer 204 to the object being imaged (e.g., finger) divided by the desired optical resolution of the finger. In some embodiments, the collimator apertures 220 are cylindrical or conical in shape. The sidewalls of the collimator apertures 220 may include grooves or other structures to prevent stray light from reflecting off the walls and reaching the optical sensing elements. The effective aspect ratio is determined by the average hole diameter along the height (or length) of the collimator holes. Examples of suitable aspect ratios are ratios in the range of about 3:1 to 100:1 and more typically in the range of about 5:1 to 20:1.

It is generally desirable to make the height 244 of the collimator apertures 220 as thin as possible to provide the most flexibility for fabricating the collimator filter layer 204 and integrating it with the underlying image sensor array 202, such as a CMOS or CCD image sensor. A small aperture diameter 246 may be used to maintain the desired collimator aspect ratio. However, if the aperture is made too small (less than a few times the wavelength of light being used), diffraction effects can contribute to additional blurring as the light rays exiting the collimator apertures 220 diverge. Such diffraction effects can be mitigated by placing the collimator filter layer 204 as close to the image sensor array 202 as possible, ideally much closer than the Fraunhofer far field distance ($r^2$/lambda, where r is the aperture radius and lambda is the light wavelength).

It is also generally desirable to minimize the distance between the collimator filter layer 204 and the image sensor array 202 to allow the light reaching the optical sensing elements of the image sensor array 202 to be as concentrated as possible. In addition, if this sensor array 202 to collimator filter layer 204 distance is too large, stray light from adjacent holes may reach a particular optical sensing element, contributing to image blurring.

If the image sensor array 202 is a CCD or CMOS image sensor, where the optical sensing element pitch (distance between elements) may be smaller than the collimator hole pitch (distance between holes), the light passing through a single collimator aperture 220 may illuminate more than one optical sensing element. Such an arrangement is shown by optical sensing elements 234 and 236 in FIG. 4. In such cases, the processing system (FIG. 1) may combine the light intensity recorded by all the optical sensing elements corresponding to a given collimator aperture. The resulting fingerprint image after processing raw data from the image sensor array 202 may have a resolution corresponding to the array of collimator apertures. It will be noted that the arrangement of apertures 220 in the collimator filter layer 204 may result in some optical sensing elements in the sensor array 202 going unused. Examples of unused optical sensing elements are sensing elements 240. Because optical sensing elements 240 are not underneath a collimator hole, reflected rays will be blocked before reaching them. Image processing may remove the unused sensor elements and scale the image appropriately before the data is used in image reconstruction or image matching, for example.

The imaging resolution (in dpi) of the optical sensor 200 is defined by the resolution of the apertures 220 in the collimation filter layer 204 whereas the pitch is the distance between each aperture. In the optical sensor 200, each aperture 220 in the collimator filter layer 204 corresponds to a sample of a feature of the object 216 being imaged, such as a sample from a ridge or valley within a fingerprint. To maximize resolution, the sampling density (which is equal to the aperture density) should be large enough such that multiple samples are taken of each feature of interest. Thus, for example, to image ridges in a fingerprint, the pitch may be on the order of 50 to 100 microns since the pitch of the ridges themselves is on the order of 150 to 250 microns. If it desired to capture more granular features, such as pores in a fingerprint, a smaller pitch such as 25 microns would be appropriate. Conversely, a larger pitch can be used to capture larger features of the input object.

The optical sensor 200 performs similarly over a wide range of distances between the collimator filter layer 204 and the sensing surface 220 because the filtering of reflected light is generally thickness independent, as long as the aspect ratio of the holes in the collimator filter layer 204 is chosen to support the desired optical resolution.

Figure 5:
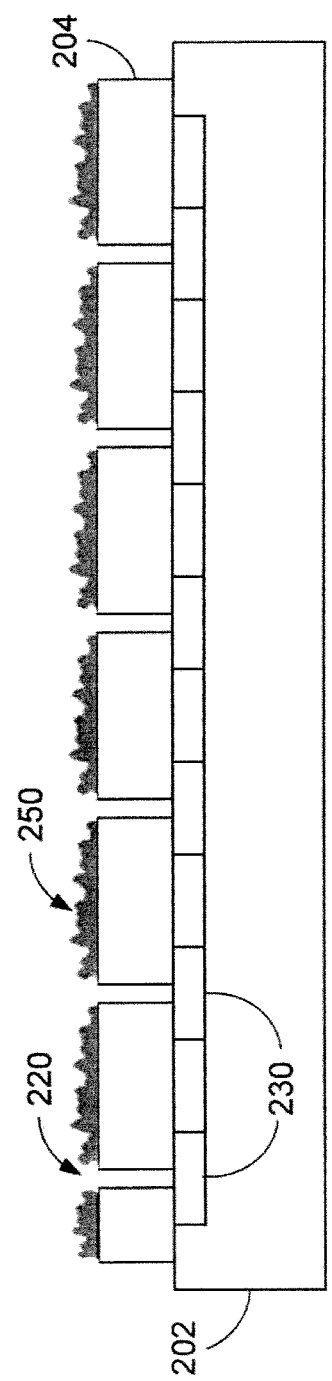
FIG. 5 illustrates an alternative embodiment of a collimator filter layer according to an embodiment of the disclosure.

FIG. 5 shows an alternative embodiment of the collimator filter layer 204. As described above, the collimator filter layer 204 is made of light-absorbing materials and includes an array of apertures 220. In the alternative embodiment shown, the top surface of the collimator filter layer 204 further includes a reflecting layer 250. The reflecting layer 250 allows light beams which would normally be absorbed by the collimator filter layer 204 to be reflected back upwards towards the sensing region. Redirecting the light back to the sensing region allows the reflected light to be recycled so that some of the recycled light can be reflected off the input object to be imaged and transmitted through the collimator filter layer apertures.

Inclusion of the reflecting layer 250 minimizes light loss by reflecting the stray light back to the input object 216 without requiring a high level of illumination in the overall sensor package. The top of the light-absorbing collimator filter layer body may be roughened up using various texturizing techniques, including but not limited to, sandblasting, coating with fillers, UV embossing or dry etching. This roughened-up top may then covered with a thin layer of metal, which creates a surface that is multifaceted in a randomized fashion. The reflecting layer 250 may be made of any suitable material that will reflect light such as aluminum, chromium, and silver to name a few examples.

The method and system disclosed contemplate various ways to include the collimator filter layer 204 into the overall structure of the optical sensor 200. For example, the collimator filter layer 204 may be a pre-patterned structure that is laminated or stacked onto the image sensor array 202, as generally depicted in FIGS. 3-4. Alternative embodiments are contemplated by the present disclosure as will be described in more detail below. For example, one alternative embodiment is to pattern or create the collimator filter layer 204 directly onto a, image sensor die or wafer, e.g., CMOS die or wafer, as generally depicted in FIG. 5. Further examples are depicted beginning with FIG. 7. Examples of methods for fabricating optical biometric sensors, including optical sensor wafer including a plurality of optical sensor device are described below beginning with FIG. 13. For example, a wafer-level collimator layer may be formed by micro-fabrication. Instead of placing a separate collimator filter layer 204 on top of the image sensor array 202, back-end processes are added to image sensor array fabrication. With this technique, no separate manufacturing of the collimator filter layer is required. On top of the image sensor array, liquid-type polymer resin with light-absorbing dyes such as carbon black may be coated first then cured to form the collimator filter layer body. After the polymer resin is cured, metal may be optionally sputtered onto the cured resin top to act as a reflective layer. The aperture pattern may be made through photolithography and etching of the metal and the polymer layer underneath subsequently to create the apertures. As a final step, the metal layer can be roughened up to create a reflecting/diffusing layer.

Figure 6:
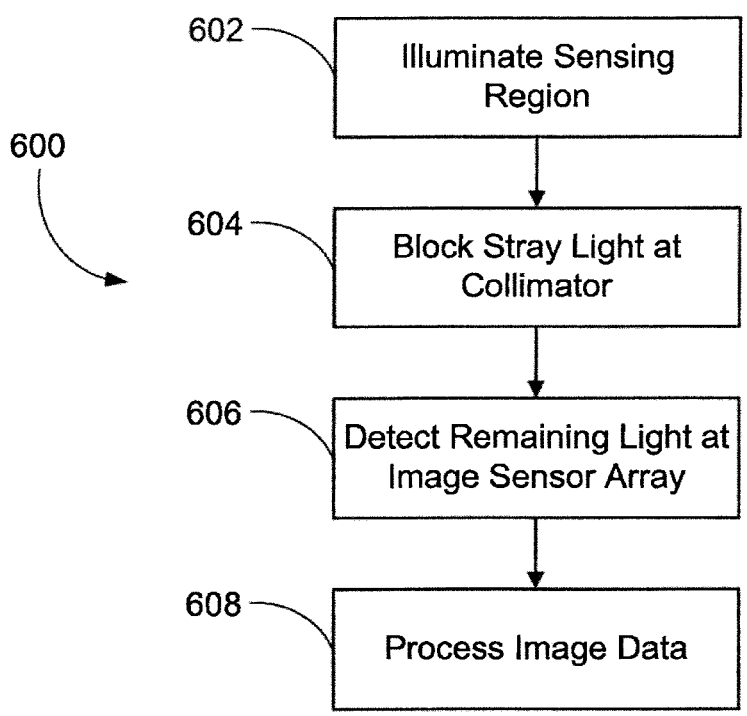
FIG. 6 illustrates a method of imaging an input object according to an embodiment of the disclosure.

FIG. 6 shows a method 600 of imaging in accordance with the present disclosure. In step 602, the sensing region is illuminated using an illumination layer having a light source and/or light guiding element. As previously described, this may be done by using a light source directing light into a separate light guiding element or by transmitting light directly into the cover layer. The transmitted light is directed towards a sensing region above the cover layer and reflected from the object towards the light collimator layer.

In step 604 some of the reflected light is blocked at the collimator filter layer while other light passes through apertures in the collimator filter layer. Generally, light rays at relatively near normal incidence to the collimator filter layer will pass through the apertures while light rays further from normal incidence will be blocked. Light may be blocked by the top surface of the collimator layer, an intermediate layer of the collimator, a bottom layer of the collimator, or sidewalls of the collimator aperture.

In step 606, the light which passes through the collimator filter layer becomes incident on one or more optical sensing elements on the sensor array below the light collimator layer. In instances where more than one sensing element is below a particular aperture in the collimator filter layer, the detected light at the sensing elements may be averaged or otherwise combined. The image data may be adjusted to account for sensing elements that are not below an aperture.

In step 608, the detected light at the image sensor array is processed to form an image or a partial image of the input object. Such processing may include, for example, stitching partial images together, relating various partial images to one another in a template, and/or comparing captured image data to previously stored image data as part of an identification or verification process.

FIGS. 7-11 depict various embodiments of silicon image optical sensors that include features to enable high performance for use as a fingerprint sensor. These features include any of: 1) collimator filter structures above the light sensor elements (also referred to herein as optical sensor elements or sensing pixels) to restrict the acceptance angle of the incoming light (to facilitate precise imaging through thicknesses of material); 2) non-sense devices/circuit elements dispersed within the same layers as the optical sensing pixels to economize the silicon usage; 3) Light absorbing materials/coatings to reduce large angle light; 4) use of through silicon via (TSV) to connect the image sensor die and facilitate the use of back-side-illuminated (BSI) orientation; 5) optical sensing elements located to discriminate between low-angle and high-angle light; 6) use of two ASICS to enable modularity of features.

Figure 7:
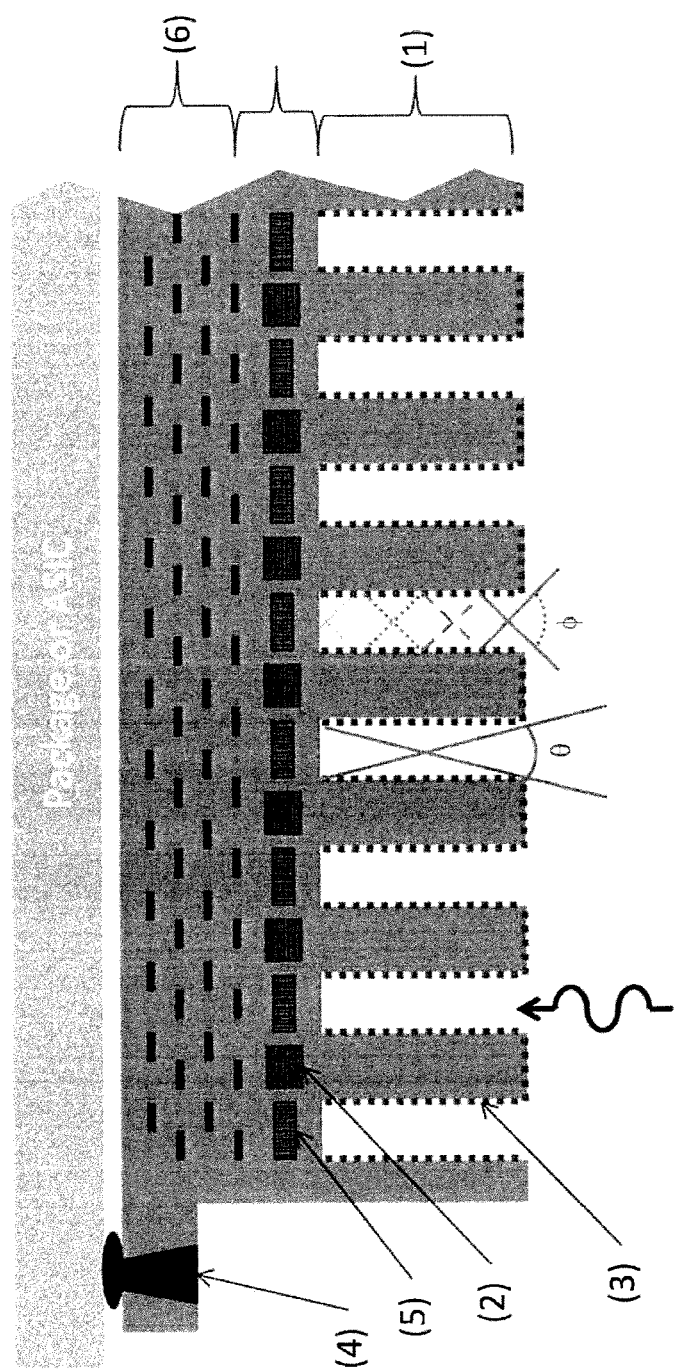
FIG. 7 depicts an image sensor structure in accordance with the present disclosure.

FIG. 7 depicts an image sensor structure in accordance with the present disclosure. The sensor structure in FIG. 7 is a CMOS optical fingerprint sensor including: wafer-scale integrated collimator filters (1); non-sense devices and circuit elements (2) co-planar with light sensing pixels or optical sensing elements (5) disposed in the area between the collimator apertures (behind a blocking portion of the collimator filter); light absorbing materials or coatings (3) to reduce large-angle light; through silicon via connection (TSV) (4) to facilitate a backside illumination (BSI) orientation for the image sensor; re-distribution layers (6); and an illustration of large angle ($\varphi$) and low angle ($\theta$) light.

One option for creating a collimator filter is to laser drill holes through a black mylar film, then place this film directly on top of the pixel sensor array of a CCD image sensor. When images are taken with the collimator filter in place, the raw images may require considerable reconstruction to convert them into the resolved images for the desired application. There are some drawbacks to this approach that make it less desirable for a practical consumer fingerprint sensor. For example, building the collimator filter as a separate film and attaching it creates the potential for many defects (e.g., misalignments, banding and/or missing pixels). It would be beneficial if these filters can be created using wafer-level processes to lower fabrication costs and reduce the possibilities for defects. Further, it is noted that the collimator filter may only transmit light to a small fraction of the pixels in the image sensor. For example, with a 1000 dpi setup for the sensing pixels, a sense area of approximately 10 um in diameter for every 25 um, or roughly only 13% of the total area of the image sensor may be needed. This could result inefficient use of processed silicon or higher silicon fabrication costs than desired.

Figure 8:
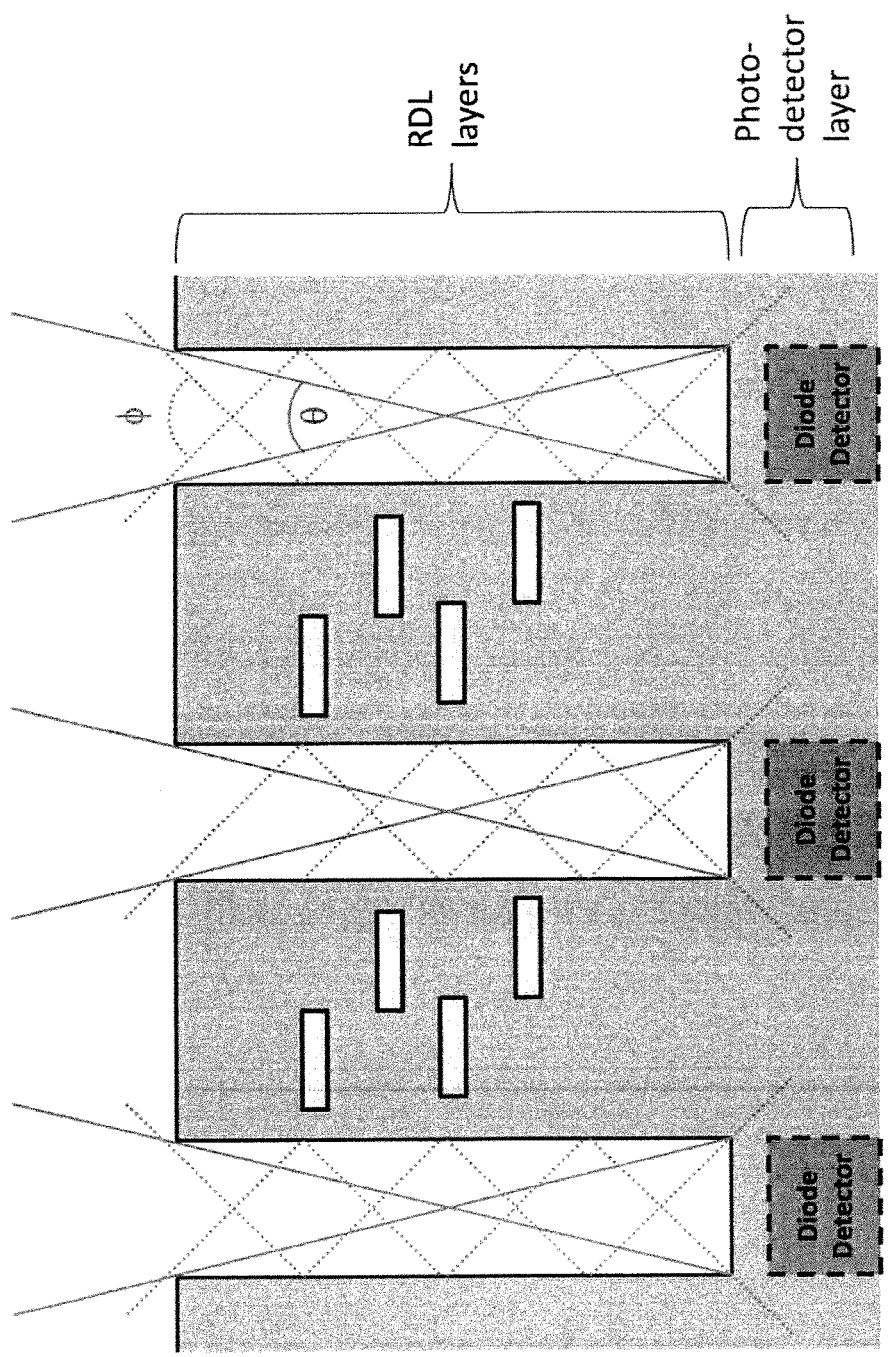
FIG. 8 depicts another image sensor structure in accordance with the present disclosure. More specifically.
Figure 9:
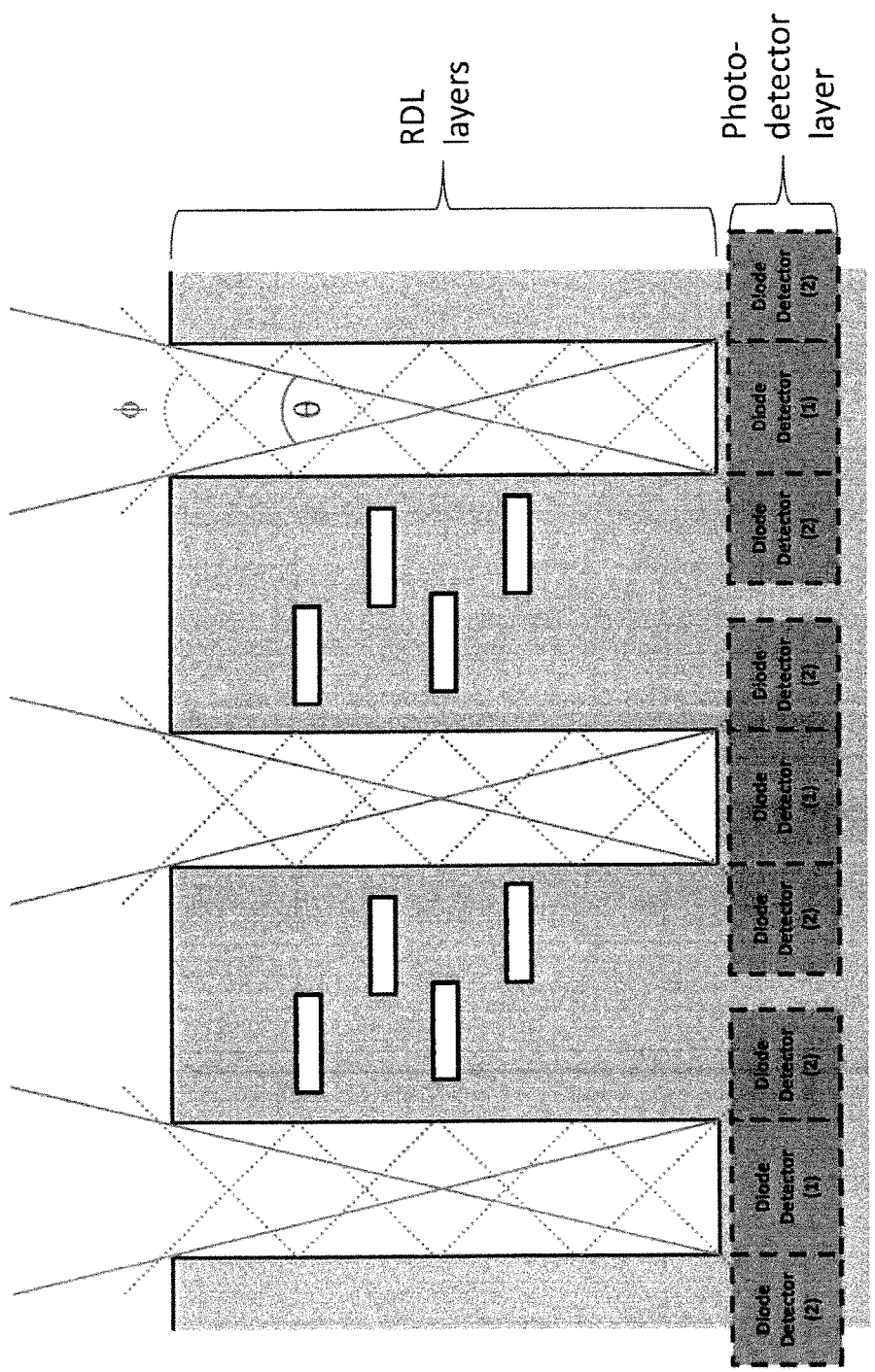
FIG. 9 depicts another image sensor structure in accordance with the present disclosure. More specifically.
Figure 10:
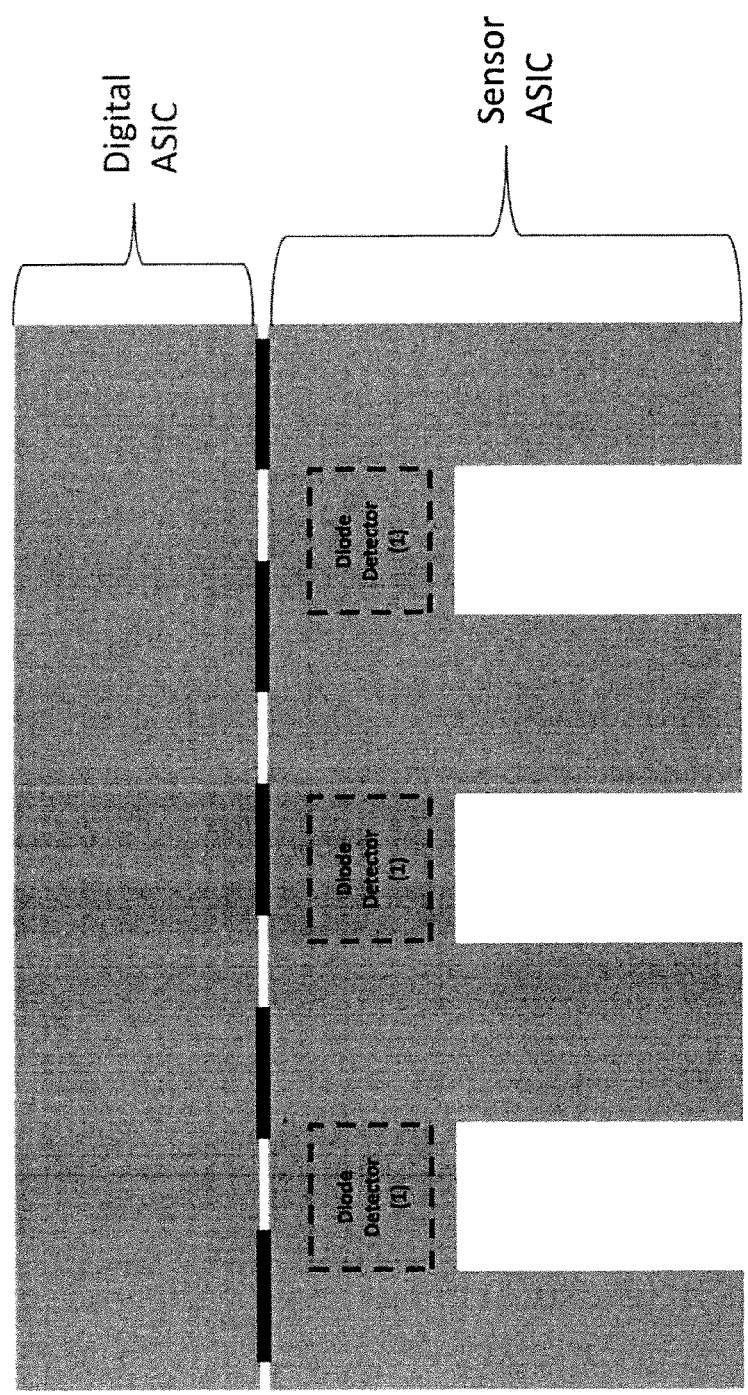
FIG. 10 depicts another image sensor structure in accordance with the present disclosure. More specifically.
Figure 11:
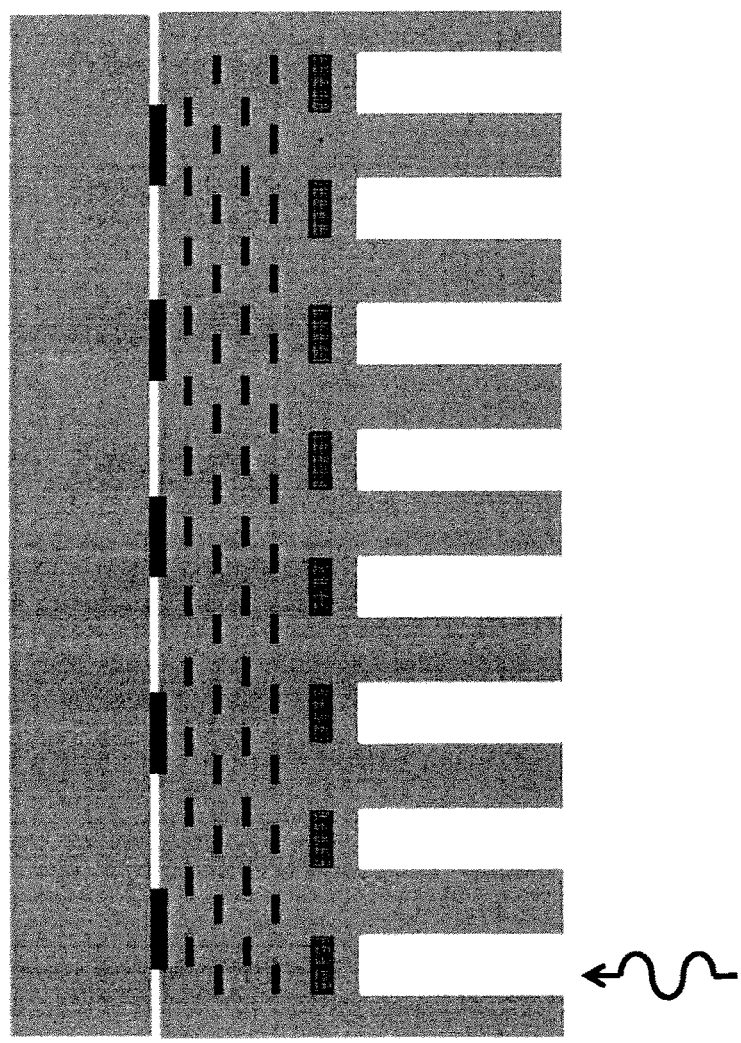
FIG. 11 depicts another image sensor structure in accordance with the present disclosure. More specifically.

The present disclosure addresses these and other issues, for example with the features contained in the embodiments of FIGS. 7-17. Note that the image sensor structures will be described with respect to a CMOS image sensor for purposes of illustration. It should be understood, however, that this disclosure is applicable to other types of image sensors, such as CCD sensors or sensor arrays. When these sensors are fabricated, there are typically metal redistribution layers (RDLs) built above the layer of optical light sensor pixels. These layers may be used, for example, for routing from the optical elements/sensing pixels in the silicon. These metal layers are illustrated as black dotted dashed lines in FIGS. 7 and 11, and rectangles in the blocking portion of the collimator filter in FIGS. 8 and 9. FIGS. 7 and 11 illustrate embodiments using backside illuminated (BSI) structures. FIGS. 8 and 9 illustrate embodiments using frontside illuminated (FSI) structures.

For CMOS sensors today, there are several constructions for ordinary image sensing applications. One such construction is to form light pipes through the RDLs. In these "front-side-illuminated" (FSI) structures, the light detected by the image sensor is introduced on the RDL side and reaches the sensors through these light pipes. These light pipes have many features that enhance the ability to collect all light at as large a range of angles as possible and efficiently deliver the photons to the sensor, including improving reflection on the side walls of the light pipes, and microlenses that are configured as converging optical elements. Another construction is the Back-side-illuminated (BSI) construction, where light is introduced from the side opposite the RDLs. In these constructions, RDLs are built up on the front side as before, but without light pipes on this RDL side. Instead, the sensing pixels/optical sensing elements of the image sensor are exposed from the backside by thinning the wafer from the backside opposite the RDLs.

Embodiments of this disclosure include image sensor structures that differ from ordinary image sensors in many respects to facilitate biometric feature (e.g., fingerprint) sensing. In a "front side illuminated" (FSI) construction of the present disclosure, as illustrated in FIGS. 8 and 9, collimator filter apertures may be formed directly through redistribution layers (RDLs) built up on the front side of the image sensor. Note that these collimator filters differ from the light pipes of ordinary image sensor applications. For example, the light pipes of ordinary applications are necessarily trying to channel light of all angles down through the RDLs to reach the sensors, whereas in this collimator filter approach, the design is enhanced to reject wide-angle light. This may be done by, for example, coating absorbing materials on to the surfaces of the holes so large angle light is absorbed, by creating a large ratio of height to hole diameter (see aspect ratios described above), by using diverging optical elements that de-focus and reject wide-angle light, and by blocking any light from transmitting into the silicon from the top surface by reflection. U.S. patent application Ser. No. 15/087,544, entitled "Biometric Sensor with Diverging Optical Element," filed concurrently herewith, discloses detail diverging optical elements, including diverging microlens elements, and is incorporated herein by reference for all purposes.

In a BSI construction, as illustrated in FIGS. 7 and 11, the collimator filter apertures may be fabricated directly into the bulk silicon. In FIGS. 7 and 11, this is shown as selective etching of the backside of the image sensor wafer to form the collimator apertures, thus only exposing some of the pixels to the backside while leaving behind some of the image sensor wafer to act as a light blocking portion of the collimator filter.

It is noted that the sensing side (e.g., sensing region side) of the image sensor structure corresponds to the side having the collimator apertures or holes. Thus, the sensing region (e.g., for a fingerprint input) for the image sensor structure in FIGS. 7 and 11 corresponds to the bottom of these drawing sheets, while the sensing region for the image sensor structure in FIGS. 8 and 9 corresponds to the top of these drawing sheets.

As illustrated in FIG. 7, a BSI construction using through silicon vias (TSV) can be used to connect an image sensor ASIC to a packaging substrate (PCB, etc.).

A BSI construction can also use TSV to mount an image sensor ASIC to a second ASIC. This second ASIC could contain digital capability such as image processing, encryption, fingerprint matching capability, memory, etc.

As shown in FIG. 7, devices and circuitry (2) can be added in the sensor layer of the image sensor die/wafer that is not needed for capturing incoming light. This can be added in the area of the image sensor blocked by the collimator filter.

It is also noted that light which exits the collimator filter may have a different radial distance from the center which will depend on the entrance angle of the light. It may be useful to segregate the pixel(s) under each hole to discriminate between light of a large angle from that of a small angle, (e.g., Diode Detector (2) and Diode Detector (1), respectively, as shown in FIG. 9).

This disclosure also describes various additional ways to fabricate a collimator layer with silicon (Si) wafers. By way of example, these may be formed at the wafer level by attaching a collimator filter wafer to an image sensor wafer, as described below.

Figure 12:
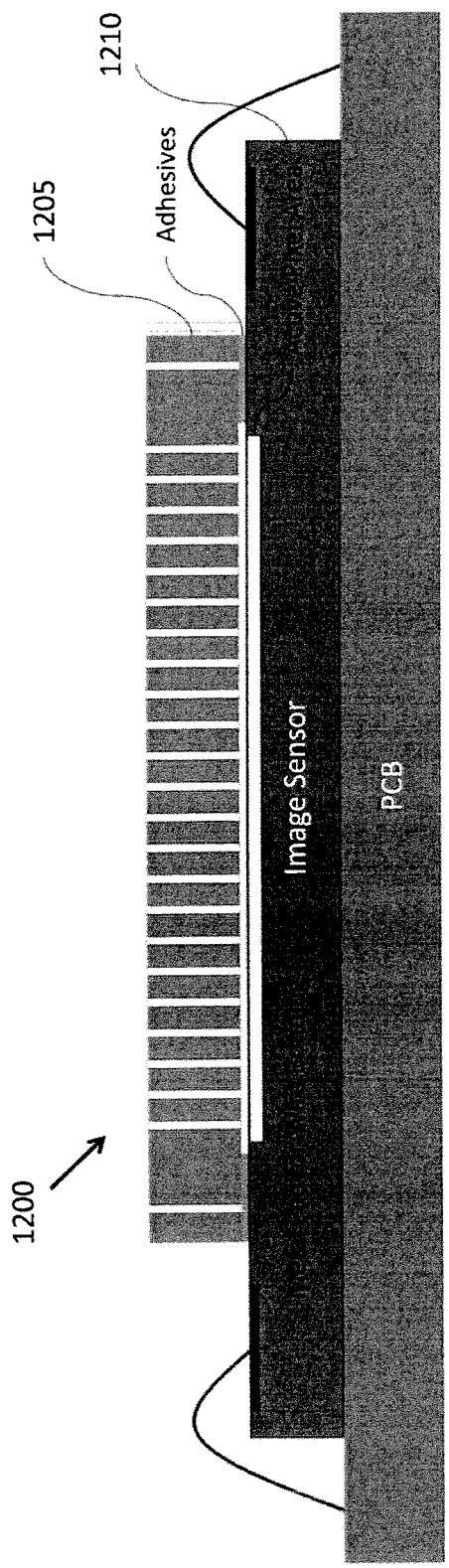
FIG. 12 depicts another image sensor structure in accordance with the present disclosure.

An exemplary optical image sensor structure 1200 with a collimator filter layer 1205, having an array of collimator filter apertures or holes, bonded to an image sensor layer 1210 is shown in FIG. 12 and general process steps for fabricating the same according to certain embodiments are shown in the FIGS. 13-18. FIG. 13 illustrates a process 1300 for fabricating a collimator filter layer 1205 according to an embodiment. In step 1310 (FIG. 13A), a mask layer 1302 is added to the polished side of a wafer substrate 1304, e.g., single-side polished Si wafer. The mask layer 1302 includes a mask material that should have significantly slower etch rate, compared to the wafer substrate (e.g., Si) etch rate. Typically, silicon dioxide, SOC (Spin-on-Carbon), metal, and photoresist materials are used. After the mask layer is formed, in step 1320 (FIG. 13B), the mask layer 1302 is patterned to form an etch mask 1306 defining a collimator hole pattern. If photoresist is used (e.g., a soft mask), patterning can be done with traditional lithography processes such as spin-coating, baking, exposure and development. If other mask materials are used (e.g., hard masks), an additional layer of photoresist should be applied on top of the hard mask to create patterns/holes in the mask layer with traditional lithography processes, followed by wet or dry etching of exposed areas in the etch mask.

Once etch mask 1306 including the hole pattern is created, in step 1330 (FIG. 13C), the frontside (F) of the wafer substrate 1304 is attached to a support structure $1308_1$ (e.g., a UV tape) and thinned down from the backside (B) using conventional wafer thinning techniques. The target thickness should be determined based on the desired collimator filter hole size and the pitch. The target thickness (and hence the desired length or depth of the collimator holes) is generally between about 30 μm and about 300 μm, where an initial thickness of the wafer substrate is greater than about 500 μm, e.g., from about 500 μm up to about 1 mm or 2 mm. After wafer thinning, the wafer substrate is removed or detached from the support structure (e.g., UV tape) and, in step 1340 (FIG. 13D), attached to another support structure $1308_2$ (e.g., a UV tape) on the backside (B), revealing the frontside (F) where the etch mask 1306 is located.

Figure 14B:
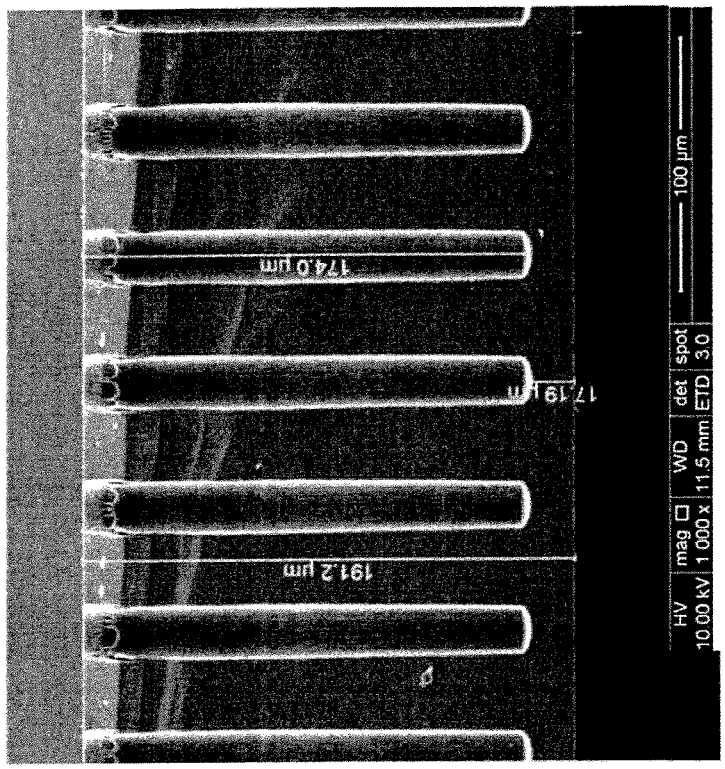
FIG. 14 depicts, on the LEFT: Wafer with etch mask attached to UV release tape, and on the RIGHT: Cross-section of unfinished collimator vias.
Figure 14A:
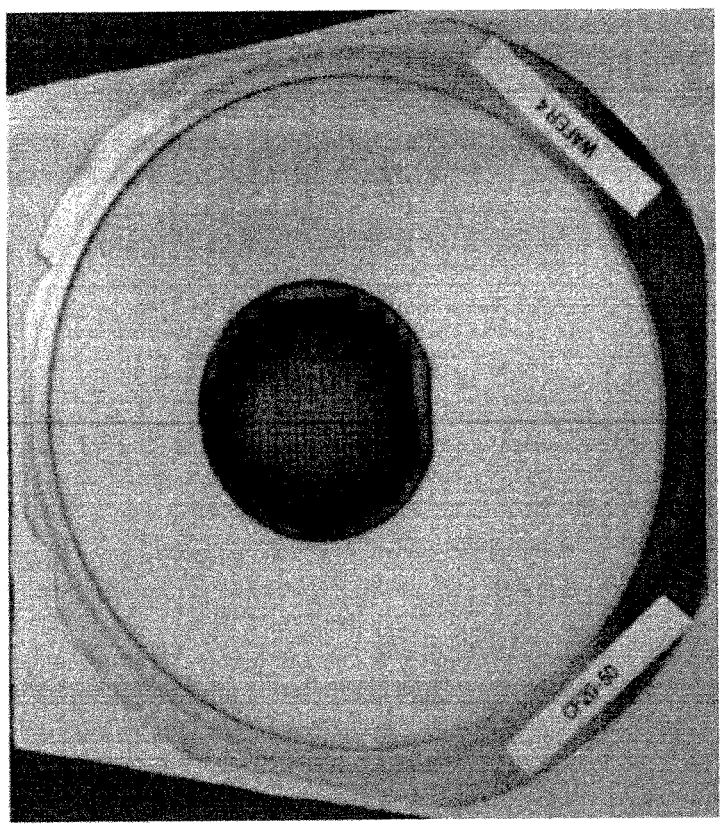

An example of a thinned-down wafer substrate attached to a UV tape $1308_2$ (attached wafer substrate) is shown in FIG. 14A. In step 1350 (FIG. 13E), the attached wafer substrate is etched to form collimator filter holes or vias in the wafer substrate 1304. For example, the attached wafer substrate may be placed in a Si DRIE (deep reactive ion etching, also known as "Bosch" process) equipment chamber to go through Si etching to make the holes or vias. The etcher should be equipped to handle the UV tape. One such etcher is the MicroDie Singulator™ from Plasma-Therm, LLC. The vias from this DRIE step can be created straight down (see FIG. 14B, which shows an example of etched collimator vias or holes extending partially through the Si substrate) and at a high aspect ratio. After the etching step 1350 is completed, in step 1360 (FIG. 13F), the collimator filter wafer can be detached from the support structure $1308_2$. The detached collimator filter wafer is then aligned with and attached (e.g., adhesive bonded) to an image sensor wafer to form an optical sensor wafer having a plurality of light collimating apertures or holes in the collimator filter layer aligned with a plurality of light sensing elements or pixels in the image sensor wafer. After formation of the optical sensor wafer, the image sensor wafer is singulated to form a plurality of individual optical image sensor structures 1200 (e.g., individual optical biometric sensors), each having a plurality of light collimating apertures or holes in the collimator filter layer aligned with a plurality of light sensing elements or pixels.

Figure 15:
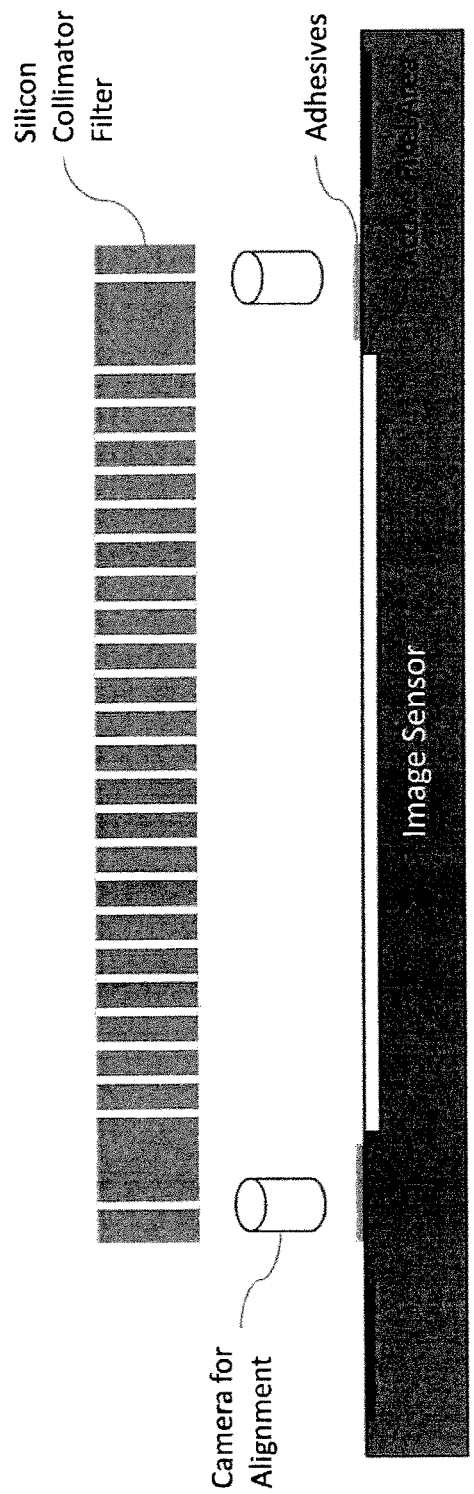
FIG. 15 depicts alignment of collimator filter to an image sensor.

In order to achieve consistent placement of collimator filter layer 1305 and avoid any skew during assembly, alignment between the collimator filter holes and image sensor elements/pixels in an active sensing area is desired. Good alignment is also desirable to make the image construction process more robust and consistent from module to module. Alignment marks (or fiduciary marks) should exist on both the collimator filter wafer and the image sensor wafer. Based on the alignment marks on the image sensor wafer, new sets of alignment marks may be created when the collimator wafers are processed. In one embodiment, such fiduciary marks are created on the frontside of the wafer substrate as part of the etch mask patterning step 1320 and/or during the etching step 1350. Wafer bonding systems have several alignment techniques, and one of the alignment techniques that may be applied according to an embodiment is called "inter-substrate" alignment as shown in FIG. 15. The camera(s) locate between the wafers and observe the alignment marks on the bottom of the upper wafer and on the top of the lower wafer. When it is confirmed that both wafers are aligned, the wafers are locked in place and ready for bonding. With this technique, 3D stacking such as die-to-wafer or wafer-to-wafer bonding becomes possible.

Attachment of a collimator filter wafer to an image sensor wafer can be done, e.g., using wafer bonders from Suss MicroTec, EVG, Ayumi, etc., after alignment is completed. Both heat and pressure help to bond the wafers together. There are several bonding types (metal, oxide, eutectic, direct, etc.), and adhesive bonding is advantageous since no high temperature (<200 deg C.) is used, and no strict requirement exists regarding smoothness of the bonding surface. The image sensor wafer is coated with adhesive and patterned to only cover the areas between the edge of the image sensor pixel area and the bond pads. The bond pads should not have anything on top to make wire bonding possible, unless TSV (through silicon via) is used to make connections between the image sensor and the PCB underneath.

Figure 16:
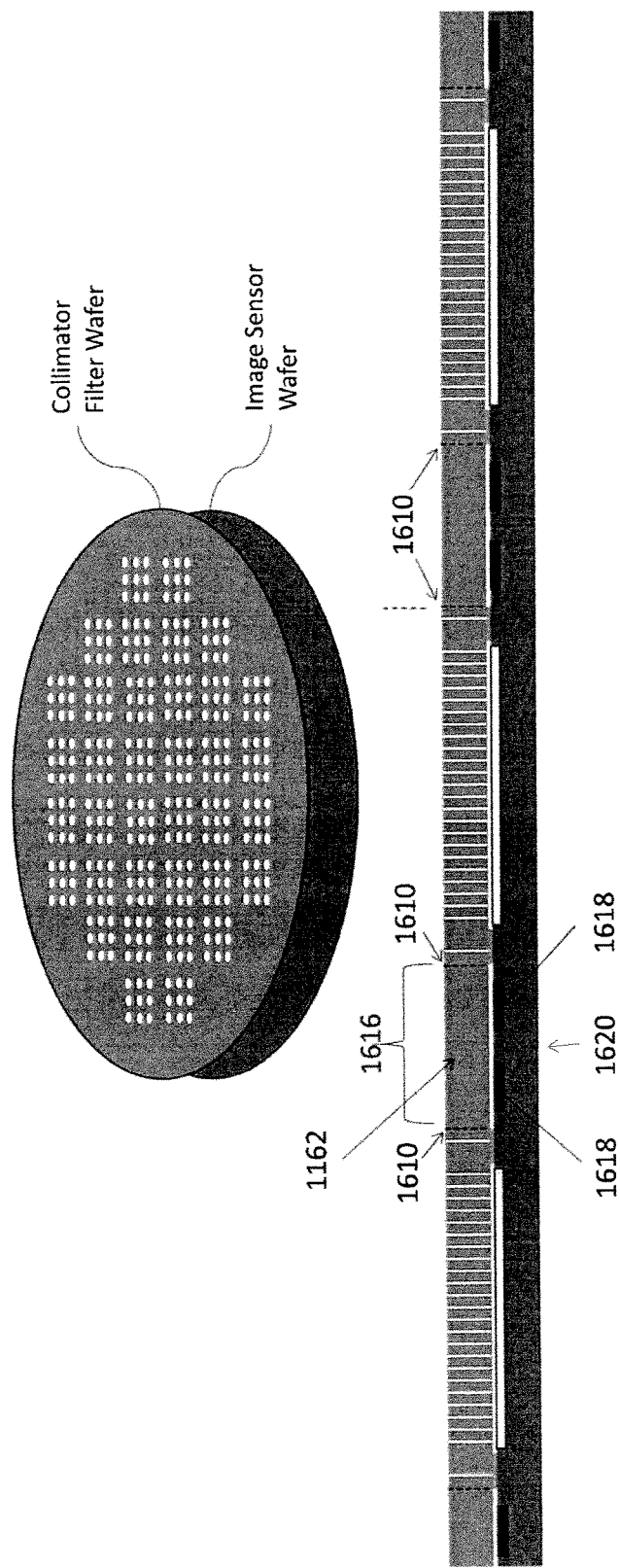
FIG. 16 depicts wafer-to wafer bonding and removal of Si on top of bond pads (The dotted lines indicate scribe lines).
Figure 17A:
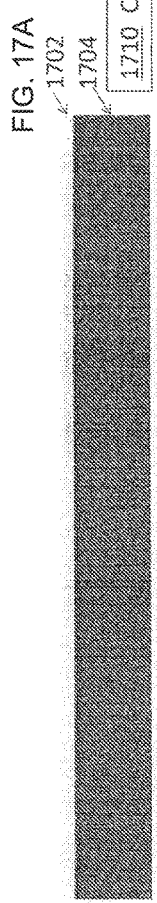
FIG. 17 depicts another process flow for an alternate way of forming an image sensor structure with a collimator filter in accordance with an embodiment of the present disclosure.
Figure 17B:
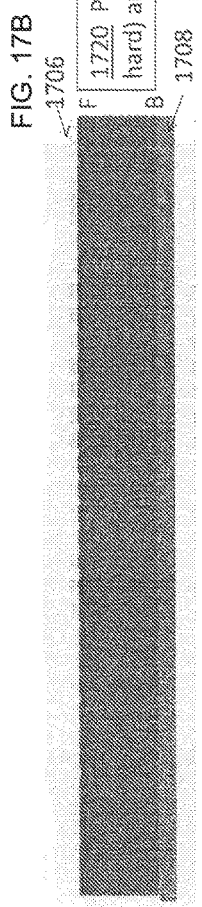
Figure 17C:
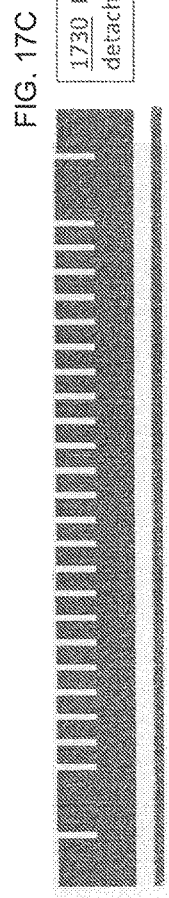
Figure 17D:
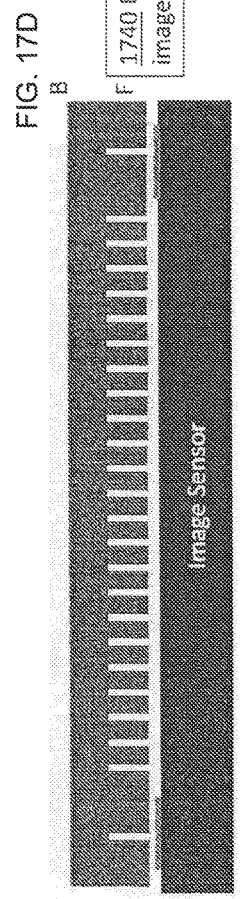
Figure 17E:
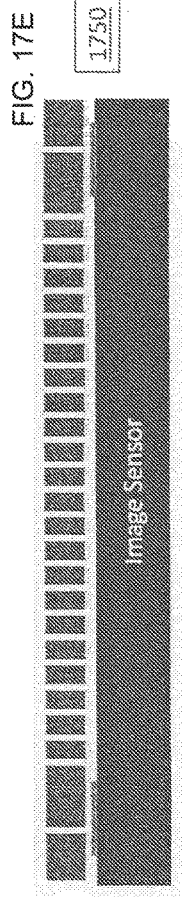

FIG. 16 shows different scribe lines 1610 for the collimator filter wafer and the image sensor useful to remove substrate material (e.g., silicon) on top of bond pads 1618 of the image sensor. For example, in one embodiment, forming the collimator filter wafer includes forming a plurality of scribe line pairs 1616, where each scribe line pair 1616 defines a removal region 1612 therebetween in the collimator filter wafer. The image sensor wafer also includes a pair of bond pads 1618 under each removal region 1612 of the collimator filter wafer. In one embodiment, singulating the image sensor wafer includes removing each removal region 1616 in the collimator filter wafer between each scribe line pair 1616, e.g., by half-cut dicing or by etching, to thereby expose each pair of bond pads 1618 (and scribe lines 1620) in the image sensor wafer. Singulating further includes dicing the image sensor wafer at the scribe line 1620 between each bond pad 1618 of each bond pad pair. If TSV is applied, removal of wafer substrate material above the image sensor scribe lines 1620 may not be needed and the same scribe line 1620 can be shared by both the collimator filter wafer and the image sensor wafer.

It should be noted that, in addition to the UV carrier tape, a carrier wafer may also be used for mechanical stability and to preserve precise registration across a wafer. Also, for a full wafer-wafer process, in one embodiment, the individual per-die collimator hole fiduciary or alignment marks are etched using the same etch that is used for forming the collimator holes. This results in individual collimator filter layers (i.e. one collimator filter layer per image sensor die, with each collimator filter layer having an array of apertures), but the individual collimator filters may be attached to a carrier wafer that all may be bonded to the image sensor wafer in a wafer-wafer bond process.

As an alternative, the collimator filter wafer may be partially etched during the etching, e.g. Si DRIE step, and thinning may occur after bonding to the image sensor wafer is completed, as illustrated in process 1700 of FIG. 17. This alternate method will eliminate one support structure (e.g., UV tape) bonding step from the previously described process. In step 1710 (FIG. 17A), a mask layer 1702 is added to the polished side of a wafer substrate 1704, e.g., single-side polished Si wafer. The mask layer 1702 includes a mask material that should have significantly slower etch rate, compared to the wafer substrate (e.g., Si) etch rate. Typically, silicon dioxide, SOC (Spin-on-Carbon), metal, and photoresist materials are used. After the mask layer is formed, in step 1720 (FIG. 17B), the mask layer 1702 is patterned to form an etch mask 1706 defining the pattern of collimator holes. If photoresist is used (e.g., a soft mask), patterning can be done with traditional lithography processes such as spin-coating, baking, exposure and development. If other mask materials are used (e.g., hard masks), an additional layer of photoresist should be applied on top of the hard mask to create patterns/holes with traditional lithography processes, followed by wet or dry etching of exposed areas in the etch mask.

Once etch mask 1706 including the hole pattern is created, the backside (B) of the wafer substrate 1704 is attached to a support structure 1708, e.g., a UV tape, (attached wafer substrate). In certain embodiments, support structure 1708 is not needed and is not used (e.g., depending on the etcher tool used). In step 1730 (FIG. 17C), the wafer substrate (e.g., attached wafer substrate) is partially etched to form collimator filter holes or vias extending partially through the wafer substrate 1704 to a target depth less than the thickness of the substrate wafer. For example, the wafer substrate may be placed in a Si DRIE (deep reactive ion etching, also known as "Bosch" process) equipment chamber to go through Si etching to make the partial holes or vias. If the wafer substrate is attached to a UV tape, for example, the etcher should be equipped to handle the UV tape. One such etcher is the MicroDie Singulator™ from Plasma-Therm, LLC. The target thickness should be determined based on the desired collimator filter hole size and the pitch. In one embodiment, the desired length or depth of the collimator holes to be formed is between about 30 μm and about 300 μm, so the target depth of the partially etched collimator holes should be at least the same as or greater than the desired length or depth of the collimator holes to be formed. The initial thickness of the wafer substrate is greater than about 500 μm, e.g., from about 500 μm up to about 1 mm or 2 mm.

After the etching is completed, the partially etched wafer substrate is detached from the support structure 1708. In step 1740 (FIG. 17D), the frontside of the wafer substrate (including partially etched collimator holes) is aligned with and attached (e.g., adhesive bonded) to an image sensor wafer. Examples of alignment and bonding techniques are discussed above. The mask layer 1706 may be kept or removed prior to bonding to the image sensor wafer. In step 1750

(FIG. 17E), the backside (B) is thinned down using conventional wafer thinning techniques to expose the plurality of partially etched holes or vias to form a collimator filter layer on the image sensor wafer, wherein the exposed holes or vias correspond to the plurality of light collimating apertures or holes. The resulting wafer structure, including a collimator filter layer on the image sensor wafer, may be singulated to produce a plurality of optical biometric sensor devices.

FIG. 18 depicts another process 1800 of forming an image sensor wafer structure with a collimator filter layer in accordance with an embodiment. In step 1810 (FIG. 18A), a wafer substrate is bonded to a carrier wafer, or carrier substrate, and then thinned to a desired thickness in step 1820 (FIG. 18B). The carrier wafer provides additional structural support to enhance processing capabilities of the substrate wafer (e.g., a thinner wafer) using various wafer processing tools. In step 1830 (FIG. 18C), a mask layer is added to the exposed side of the wafer substrate. The mask layer includes a mask material that should have significantly slower etch rate, compared to the wafer substrate (e.g., Si) etch rate. Typically, silicon dioxide, SOC (Spin-on-Carbon), metal, and photoresist materials are used. After the mask layer is formed, in step 1840 (FIG. 18D), the mask layer is patterned to form an etch mask defining the collimator holes pattern. If photoresist is used (e.g., a soft mask), patterning can be done with traditional lithography processes such as spin-coating, baking, exposure and development. If other mask materials are used (e.g., hard masks), an additional layer of photoresist should be applied on top of the hard mask to create patterns/holes with traditional lithography processes, followed by wet or dry etching of exposed areas in the etch mask.

In step 1850 (FIG. 18E), the collimator holes are formed by etching all-the-way through the wafer substrate. Additionally, the dicing of individual collimator die structures can be achieved during this etch step in one embodiment. In optional step 1860 (FIG. 18F), the mask, e.g., hard mask, may be removed, using conventional techniques Following this, in step 1870 (FIG. 18G), the wafer substrate, including the etched collimator holes, is bonded to an image sensor wafer, e.g., CMOS wafer, using a wafer-to-wafer bonding process as discussed above. In step 1880 (FIG. 18H), the carrier wafer is released from the (collimator) wafer substrate to reveal individual collimators precisely bonded to the image sensors, e.g., CMOS image sensors.

Although this invention describes optical object imaging in the context of fingerprint image sensing, the method and system may be used to image other objects as well. For example, a high resolution image of a palm or hand may be acquired by placing the hand directly on the cover layer. Imaging of non-biometric objects is also with the scope of this disclosure.

It should be understood that, as used herein, the term "collimator" in the text of collimator filter holes or hole structures does not imply that light rays entering a collimator filter hole are actively collimated (e.g., made parallel). For example, the collimator filter holes generally allow light rays entering to pass through without deviation or alteration (unless a light ray interacts with a sidewall of the collimator filter hole, in which case the light ray may be reflected or absorbed, partially or entirely, depending on the characteristics of the sidewall). It should also be understood that other semiconductor materials or semiconductor wafers (e.g., GaAs or other semiconductor material wafers) or glass or plastic materials or wafers may be substituted for the materials and wafers described herein without departing from the scope of the disclosure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of making an optical biometric sensor, comprising:

forming a collimator filter layer on an image sensor wafer, wherein a plurality of light collimating apertures in the collimator filter layer are aligned with a plurality of light sensing elements in the image sensor wafer; and after forming the collimator filter layer on the image sensor wafer, singulating the image sensor wafer into a plurality of individual optical sensors, wherein the forming the collimator filter layer includes forming the plurality of light collimating apertures and routing circuitry for light sensing elements of the image sensor wafer in one or more redistribution layers disposed on a front side of the image sensor wafer, and wherein the forming the plurality of light collimating apertures includes coating a light absorbing material on sidewalls of the light collimating apertures in the one or more redistribution layers.

2. A method of making an optical biometric sensor, comprising:
forming a collimator filter layer on an image sensor wafer, wherein a plurality of light collimating apertures in the collimator filter layer are aligned with a plurality of light sensing elements in the image sensor wafer; and
after forming the collimator filter layer on the image sensor wafer, singulating the image sensor wafer into a plurality of individual optical sensors,
wherein the forming the collimator filter layer on the image sensor wafer comprises:
forming a collimator filter wafer having the plurality of light collimating apertures; and
attaching the collimator filter wafer to the image sensor wafer.

3. The method of claim 2, wherein the forming the collimator filter wafer comprises:
providing a wafer substrate having a back side and a polished front side opposite the back side, the wafer substrate having an initial thickness;
forming a patterned mask layer on the polished front side, the patterned mask layer having a plurality of exposure holes exposing the front side of the wafer substrate;
thinning the wafer substrate, from the back side, to a target thickness less than the initial thickness; and
etching the front side of the wafer substrate to form the plurality of light collimating apertures corresponding to the plurality of exposure holes in the patterned mask layer, each of the plurality of light collimating apertures extending entirely through the target thickness of the wafer substrate.

4. The method of claim 3, further including creating fiducial alignment marks on the front side of the wafer substrate during the etching the front side of the wafer substrate or during the forming the patterned mask layer.

5. The method of claim 3, wherein the forming the patterned mask layer includes forming a masking material layer on the polished front side and patterning the masking material layer to form the patterned mask layer having the plurality of exposure holes.

6. The method of claim 2, wherein the forming the collimator filter wafer includes forming a plurality of scribe line pairs, each scribe line pair defining a removal region therebetween in the collimator filter wafer, wherein the image sensor wafer includes a bond pad pair under the removal region of the collimator filter wafer.

7. The method of claim 6, wherein the singulating the image sensor wafer further comprises removing each removal region in the collimator filter wafer between each scribe line pair by half-cut dicing or by etching to thereby expose each bond pad pair in the image sensor wafer.

8. The method of claim 2,
wherein the forming the collimator filter wafer comprises:
attaching a back side of a wafer substrate to a support structure, the wafer substrate having the back side and a front side opposite the back side, the wafer substrate having an initial thickness;
thinning the wafer substrate, from the front side, to a target thickness less than the initial thickness;
forming a patterned mask layer on the front side, the mask layer having a plurality of exposure holes through which the front side is exposed; and
etching the front side to form the plurality of light collimating apertures through the plurality of exposure holes, each of the plurality of light collimating apertures extending entirely through the target thickness of the wafer substrate; and
wherein the attaching the collimator filter wafer to the image sensor wafer includes:
attaching the front side of the etched wafer substrate to the image sensor wafer; and
removing the support structure from the wafer substrate.

9. The method of claim 8, wherein the removing the support structure occurs after the attaching.

10. The method of claim 8, further including dicing the etched wafer before attaching the front side of the etched wafer substrate to the image sensor wafer and before removing the support structure.

11. The method of claim 8, further including dicing the wafer substrate during the etching the front side.

12. A method of making an optical biometric sensor, comprising:
forming a collimator filter layer on an image sensor wafer, wherein a plurality of light collimating apertures in the collimator filter layer are aligned with a plurality of light sensing elements in the image sensor wafer; and
after forming the collimator filter layer on the image sensor wafer, singulating the image sensor wafer into a plurality of individual optical sensors,
wherein the forming the collimator filter layer on the image sensor wafer comprises:
providing a wafer substrate having a back side and a polished front side opposite the back side, the wafer substrate having an initial thickness;
forming a patterned mask layer on the polished front side, the patterned mask layer having a plurality of exposure holes through which the front side is exposed;
etching the front side to form a plurality of vias through the exposure holes, each of the plurality of vias being free of conductive material and extending partially into the wafer substrate to a target depth less than the initial thickness;
attaching the front side of the etched wafer substrate to the image sensor wafer; and
thinning the etched wafer substrate, from the back side, to a target thickness, to expose the plurality of vias, wherein the exposed plurality of vias correspond to the plurality of light collimating apertures.

13. A method of making an optical biometric sensor, comprising:
forming a collimator filter layer on an image sensor wafer, wherein a plurality of light collimating apertures in the collimator filter layer are aligned with a plurality of light sensing elements in the image sensor wafer; and
after forming the collimator filter layer on the image sensor wafer, singulating the image sensor wafer into a plurality of individual optical sensors,
wherein the forming the collimator filter layer comprises forming the plurality of light collimating apertures into a back side of the image sensor wafer, wherein a front side of the image sensor wafer includes one or more redistribution layers.

14. The method of claim 13 wherein the forming the plurality of light collimating apertures includes etching selected portions of the back side of the image sensor wafer.

15. An optical sensor wafer having a plurality of optical sensor devices for biometric sensing, comprising:
an image sensor wafer comprising an array of light sensing devices; and
a collimator filter layer disposed on the image sensor wafer, the collimator filter layer comprising an array of light collimating filter elements, wherein the array of light collimating filter elements is aligned with the array of light sensing devices, wherein the collimator filter layer comprises a plurality of scribe line pairs, each scribe line pair defining a removal region therebetween in the collimator filter wafer, wherein the image sensor wafer includes a bond pad pair under the removal region of the collimator filter wafer for each of the plurality of optical sensor devices.

16. The optical sensor wafer of claim 15, wherein each light collimating filter element includes a plurality of light collimating apertures, and each light sensing device includes a corresponding plurality of light sensing elements.

17. The optical sensor wafer of claim 16,
wherein each light collimating filter element includes a light blocking portion disposed between the plurality of light collimating apertures;
wherein each light sensing device comprises a plurality of optical sensing elements disposed under the corresponding plurality of light collimating apertures and non-sensing circuitry disposed under the corresponding light blocking portion.

* * * * *